(12) United States Patent
Krysak et al.

(10) Patent No.: US 11,984,317 B2
(45) Date of Patent: May 14, 2024

(54) EUV PATTERNING METHODS, STRUCTURES, AND MATERIALS

(71) Applicant: Intel Corporation, Santa Clara, CA (US)

(72) Inventors: Marie Krysak, Portland, OR (US); James Blackwell, Portland, OR (US); Lauren Doyle, Portland, OR (US); Brian Zaccheo, Hillsboro, OR (US); Patrick Theofanis, Pasadena, CA (US); Michael Robinson, Beaverton, OR (US); Florian Gstrein, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 192 days.

(21) Appl. No.: 17/308,813

(22) Filed: May 5, 2021

(65) Prior Publication Data

US 2021/0375616 A1    Dec. 2, 2021

Related U.S. Application Data

(60) Provisional application No. 63/033,106, filed on Jun. 1, 2020.

(51) Int. Cl.
*H01L 21/027*    (2006.01)
*G03F 7/004*    (2006.01)
(Continued)

(52) U.S. Cl.
CPC ........ *H01L 21/0274* (2013.01); *G03F 7/0042* (2013.01); *H01L 21/76877* (2013.01); *H01L 23/5226* (2013.01); *G03F 7/2004* (2013.01)

(58) Field of Classification Search
CPC .......... H01L 21/0274; H01L 21/76877; H01L 23/5226; H01L 21/0337; G03F 7/0042;
(Continued)

(56) References Cited

U.S. PATENT DOCUMENTS

| | | | |
|---|---|---|---|
| 2015/0171010 A1* | 6/2015 | Bristol | ................ H01L 21/0274 257/774 |
| 2016/0104642 A1* | 4/2016 | Bristol | ................ H01L 23/5226 438/637 |

FOREIGN PATENT DOCUMENTS

| | | |
|---|---|---|
| WO | 2018004551 | 1/2018 |
| WO | 2018004646 | 1/2018 |

(Continued)

OTHER PUBLICATIONS

Extended European Search Report from European Patent Application No. 21173332.4 dated Nov. 22, 2021, 8 pgs.

*Primary Examiner* — Caleen O Sullivan
(74) *Attorney, Agent, or Firm* — Essential Patents Group, LLP

(57) ABSTRACT

Techniques, structures, and materials related to extreme ultraviolet (EUV) lithography are discussed. Multiple patterning inclusive of first patterning a grating of parallel lines and second patterning utilizing EUV lithography to form plugs in the grating, and optional trimming of the plugs may be employed. EUV resists, surface treatments, resist additives, and optional processing inclusive of plug healing, angled etch processing, electric field enhanced post exposure bake are described, which provide improved processing reliability, feature definition, and critical dimensions.

20 Claims, 15 Drawing Sheets

(51) Int. Cl.
*G03F 7/20* (2006.01)
*H01L 21/768* (2006.01)
*H01L 23/522* (2006.01)

(58) Field of Classification Search
CPC ........ G03F 7/2004; G03F 7/0035; G03F 7/16;
G03F 7/165; G03F 7/0043
USPC ........................................................ 257/758
See application file for complete search history.

(56) References Cited

FOREIGN PATENT DOCUMENTS

| | | |
|---|---|---|
| WO | 2018004699 | 1/2018 |
| WO | 2018169538 | 9/2018 |
| WO | 2019005161 | 1/2019 |

\* cited by examiner $X^- = HO^-, NH_2^-, {}^-SH, RCO_2^-, RPO_3H^-, RSO_3^-$

EUV PATTERNING METHODS, STRUCTURES, AND MATERIALS

CLAIM FOR PRIORITY

This application claims priority to U.S. Provisional Patent Application Ser. No. 63/033,106, filed on Jun. 1, 2020, and titled "EUV PATTERNING METHODS, STRUCTURES, AND MATERIALS", which is incorporated by reference in its entirety for all purposes.

BACKGROUND

In the production of integrated circuit devices, there is a continuing need to pattern smaller features at a variety of pitches. For example, the need for metal line end-to-end (ETE) dimensions as small as 12 to 16 nm and as large as several microns in the same layer are needed for production of metallization layers in advanced integrated circuit devices. Other needs such as small features in dense pitch layouts persist. Furthermore, overlay concerns (e.g., registration between patterned layers) cause difficulty in patterning such features. Extreme ultraviolet lithography (EUV) techniques use extreme ultraviolet (UV) wavelengths such as those of about 13.5 nm and are promising for meeting the discussed patterning needs. However, current single pass EUV techniques do not offer the needed ETE resolution and continuous improvements are needed. It is with respect to these and other considerations that the present improvements have been needed. Such improvements may become critical as the desire to compress and transmit video data becomes more widespread.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
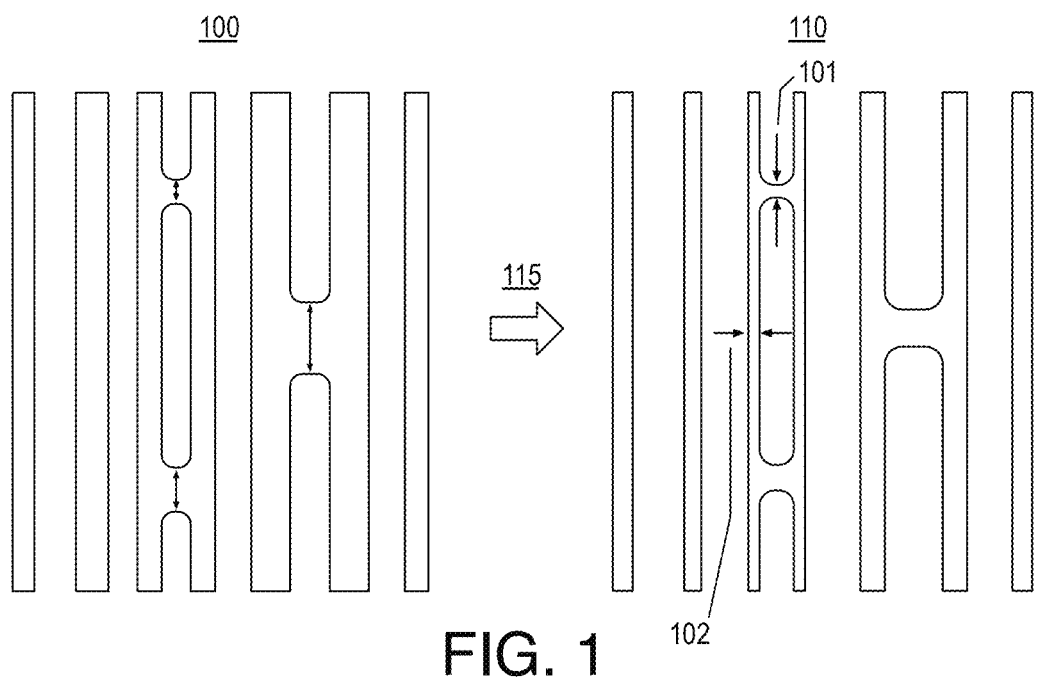
FIG. 1 illustrates example single pass EUV processing.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized, and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that some embodiments may be practiced without these specific details. In some instances, well-known methods and devices are shown in block diagram form, rather than in detail, to avoid obscuring other aspects of an embodiment. Reference throughout this specification to "an embodiment" or "one embodiment" means that a particular feature, structure, function, or characteristic described in connection with the embodiment is included in at least one embodiment. Thus, the appearances of the phrase "in an embodiment" or "in one embodiment" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

References in the specification to "one implementation", "an implementation", "an example implementation", etc., indicate that the implementation described may include a particular feature, structure, or characteristic, but every embodiment may not necessarily include the particular feature, structure, or characteristic. Moreover, such phrases are not necessarily referring to the same implementation. Further, when a particular feature, structure, or characteristic is described in connection with an embodiment, it is submitted that it is within the knowledge of one skilled in the art to effect such feature, structure, or characteristic in connection with other implementations whether or not explicitly described herein.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value. Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

Techniques discussed may be employed to pattern sub-20 nm end-to-ends (ETE) with edge placement error control suitable for device fabrication. Although discussed with respect to such ETE in some instances for the sake of clarity of presentation, the discussed techniques may be used in any patterning context at any suitable feature dimensions. The discussed techniques provide for variable ETE dimensions, for example, in the range of 12 to 16 nm that meet overlay requirements for registration between patterned layers.

FIG. 1 illustrates example single pass EUV processing. For example, current single-pass EUV ETE resolution limits are about 24 nm pitch for 0.33NA optics and about 16 nm pitch for 0.55 NA optics. While etch trim can be applied to shrink ETE dimensions, as shown, such processing simultaneously can disadvantageously increase line CD. As illustrated, post-litho (e.g., single pass EUV litho) develop check critical dimensions (DCCD) 100 may be reduced to final check critical dimensions (FCCD) 110 using a post-litho etch 115. Although such techniques reduce ETE dimensions as shown with respect to ETE dimension 101, they also increase line CD as shown with respect to line dimension 102.

In some embodiments, the techniques discussed herein include patterning a grating first (e.g., a 1D grating) and transferring the grating into a hardmask. Subsequently, an EUV patterning operation is used to define plugs within the grating. Notably, the grating may be patterned using EUV and the plug patterning may be a second EUV patterning pass. The plug (e.g., second) EUV patterning employs a material with high etch selectivity relative to the grating patterned hardmask. In some embodiments, plugs may be patterned larger than an intended, final size to circumvent EUV resolution limitations and the patterned plugs may be etch trimmed to the intended, final size without affecting the trench CD.

Figure 2:
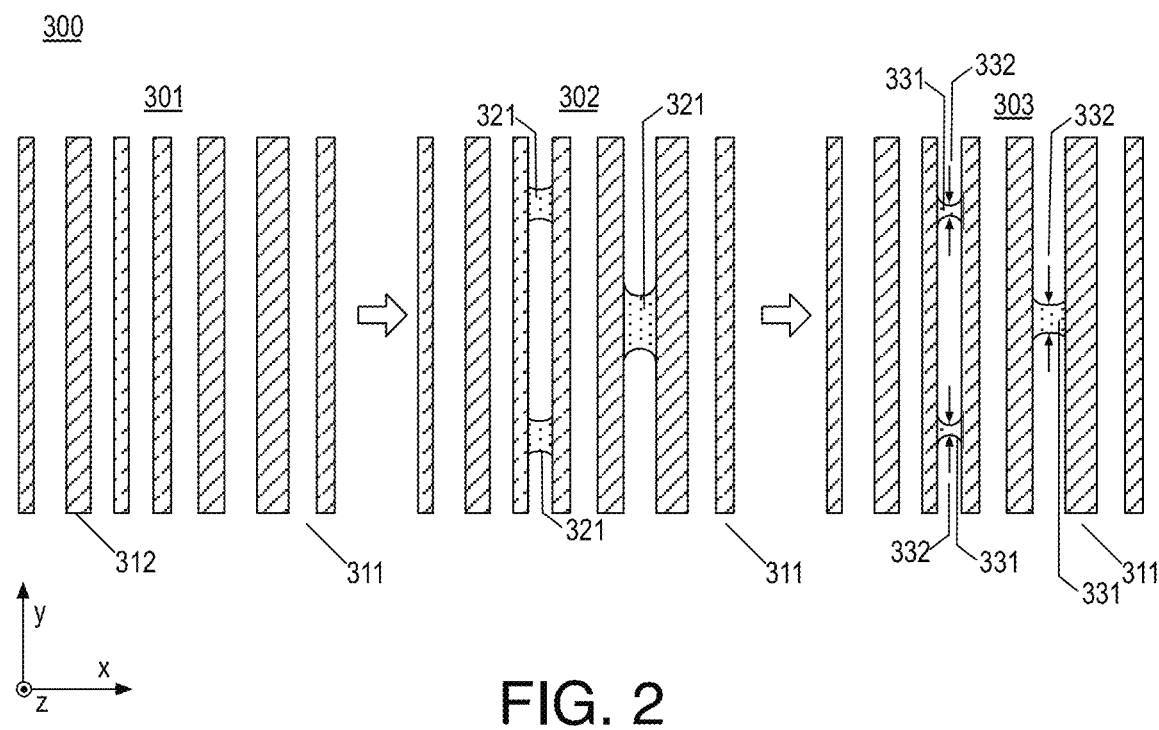
FIG. 2 illustrates an example EUV patterning process.

FIG. 2 illustrates an example EUV patterning process 300, arranged in accordance with at least some implementations of the present disclosure. At operation 301, a grating is patterned (e.g., via EUV direct print, DSA, etc. and then etch into a hardmask). For example, at operation 301, a grating (e.g., 1D grating) may be patterned via any suitable technique or techniques such as EUV direct printing, directed self-assembly or other technique such as lithography at another wavelength to generate a patterned grating (not shown). In some embodiments, the grating is patterned using single pass EUV patterning. In some embodiments, the grating is patterned using directed self-assembly (DSA). In some embodiments, the grating is patterned using spacer based pitch division (e.g., pitch halving, pitch quartering).

The grating pattern is then transferred at operation 301, via etch, into a hardmask material to provide grating 311 having any number of lines 312. For example, a grating such as grating 311 includes any number of substantially parallel lines 312, without breaks in the lines or the regions between the lines, formed on a surface such as a substrate surface of a substrate (not shown). For example, the substrate may be a substrate substantially aligned along a predetermined crystal orientation (e.g., (100), (111), (110), or the like). In some examples, the substrate includes a semiconductor material such as monocrystalline silicon (Si), germanium (Ge), silicon germanium (SiGe), a III-V materials based material (e.g., gallium arsenide (GaAs)), a silicon carbide (SiC), a sapphire ($Al_2O_3$), or any combination thereof. In some examples, the substrate includes silicon having a (100) crystal orientation with a 4°-11° miscut (with 4°-6° being particularly advantageous). Examples using silicon having a crystal orientation of (110) or (111) may offer the advantage of having a smaller mismatch for subsequent epitaxial growth. For example, the substrate may be (111) silicon, (100) silicon, or (110) silicon. In an embodiment, the substrate includes a (111) crystalline group IV material. In various examples, the substrate may include metallization interconnect layers for integrated circuits or electronic devices such as transistors, memories, capacitors, resistors, optoelectronic devices, switches, or any other active or passive electronic devices separated by an electrically insulating layer, for example, an interlayer dielectric, a trench insulation layer, or the like.

The hardmask material of grating 311 may be any suitable material that provides etch selectivity with respect to subsequent resist plugs such as silicon dioxide. Lines 312 may have approximately the same widths and pitch or they may have differing widths and/or pitches across grating 311. In some embodiments, the width of lines 312 is in the range of about 10 to 30 nm. For example, grating 311 may be provided on an underlying substrate that may include transistor devices or other integrated circuit devices such that grating 311 is formed on a substantially planar surface of the underlying substrate.

EUV patterning process 300 continues at operation 302 (e.g., a pattern plugs directly in gratings operation). For example, at operation 302, a number of plugs 321 are EUV patterned within grating 311. Plugs 321 may include any resist material discussed herein below. Plugs 321 may also be characterized as blocks, line ends, or posts and include a structure formed of resist material. As shown, plugs 321 include an etch selective resist (e.g., metal oxide resist, organic polymer resist, etc.) such that etch selectivity exists between plugs 321 and grating 311. Plugs 321 may be patterned using any suitable EUV patterning techniques discussed herein. In some embodiments, a bulk resist is coated over grating 311 (e.g., using spin coating), the resist is patterned using EUV, and the patterned resist is developed using either positive or negative tone patterning techniques to provide plugs 321. Further embodiments with respect to resist materials, mechanisms, etc. for the formation of plugs 321 are provided further herein below.

EUV patterning process 300 continues at operation 302 (e.g., a trim plugs with etch operation). For example, at operation 303, plugs 321 are optionally trimmed using a selective etch to form trimmed plugs 331. For example, the selective etch may be a wet or dry etch. In some embodiments, the etch is a plasma etch. Such techniques provide for larger plugs 321 to be patterned and then reduced in size to desired, final sizes as illustrated with respect to critical dimensions 332. For example, to overcome resolution limitations of the EUV patterning tools, plugs 321 can be patterned larger than the intended size (up to 40% larger), and etch trimmed down to their desired size after patterning. The etch processing may include any of isotropic, anisotropic plasma etches, wet chemical slimming, or directional etching.

Grating 311 and patterned plugs 331 are then used in integrated circuit processing. In some embodiments, the regions between grating 311 and patterned plugs 331 (e.g., the white space in FIG. 3) are filled with metal and polish or planarization operations are performed to provide a metallization layer (e.g., a layer of metal interconnects or traces). For example, grating 311 and patterned plugs 331 may remain as interlayer dielectric for a metallization layer. In other embodiments, grating 311 and patterned plugs 331 are formed over an interlayer dielectric (ILD) layer and used to pattern (e.g., via etch) the ILD. The resultant patterned ILD may then be used in the same manner (e.g., metal fill and polish) to form a metallization layer. For example, grating 311 and patterned plugs 331 may remain in a fabricated integrated circuit or they may be sacrificial.

Figure 3:
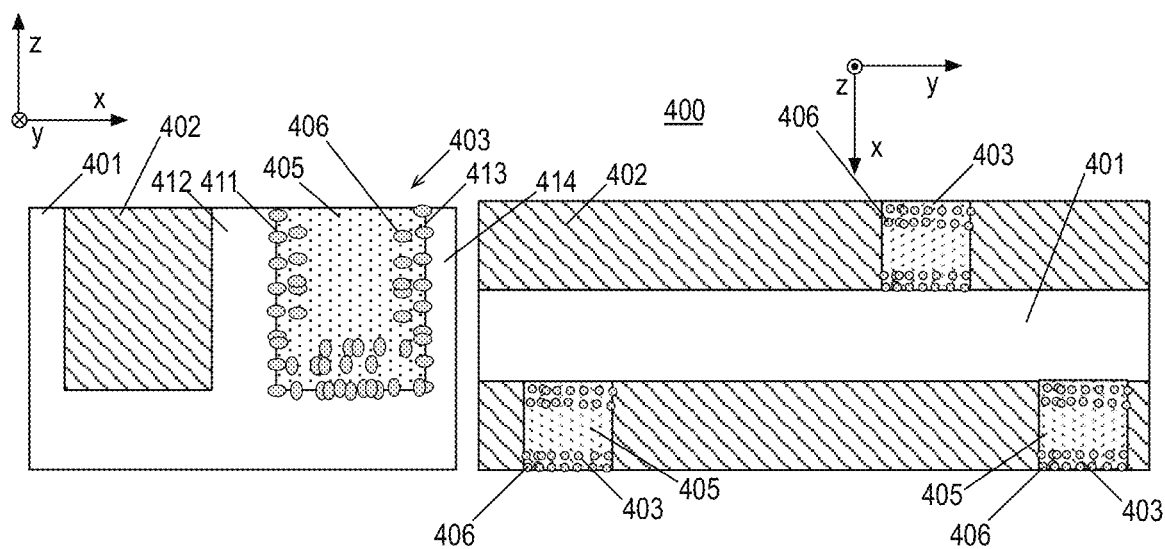
FIG. 3 illustrates an example integrated circuit structure.

FIG. 3 illustrates an example integrated circuit structure 400, arranged in accordance with at least some implementations of the present disclosure. In the example of FIG. 3, integrated circuit structure 400 includes an ILD layer 401 having a hardmask grating as discussed above. Furthermore, one or more plugs 403 are in regions between lines of ILD layer 401 and the regions between ILD layer 401 and plugs 403 include metal lines 402. For example, the metal lines 402 may provide electrical coupling between devices coupled (through vias or contacts) by metal lines 402. The left side of FIG. 3 provides a cross section and the right side of FIG. 3 provides a top down view of integrated circuit structure 400. For example, integrated circuit structure 400 includes additive/released/surface bound ligands in the left behind resist which acts as a plug.

Also as shown in FIG. 3, in some embodiments, plugs 403 include a bulk resist material 405 and a surface treatment material 406. Surface treatment material 406 may include any material discussed further herein such as surface grafted materials or agents, surface grafted molecules, etc. In some embodiments, surface treatment material 406 includes a number of molecules some of which have released groups therefrom and some of which have not. In some embodiments, surface treatment material 406 include Lewis basic nucleophiles such as amines, phosphines, sulfides and carboxylic acids. Surface treatment material 406 may be chemically bonded to ILD layer 401 (e.g., a hardmask grating) and used to enhance patterning of plugs 403. For example, FIG. 3 illustrates a trench material as ILD, but it could also be a sacrificial hardmask (e.g., comprised of amorphous silicon, silicon nitride or silicon carbide). In addition or in the alternative, bulk resist material 405 may include additives or other characteristics as discussed herein for improved EUV patterning. In particular, in some embodiments, resist materials, surface treatment materials, and gratings are included in a fabricated integrated circuit structure. In such embodiments, surface grafted material ligands may be bound to sidewalls of ILD layer 401, in plugs 403, and/or the entirety or parts of such grafted materials (e.g., ligands or functional groups) may be within bulk resist material 405 (although no longer grafted to sidewalls of ILD layer 401). In some embodiments, such released ligands or functional groups may have a higher concentration near sidewalls of ILD layer 401 than at a center of plugs 403. In an embodiment, a ligand or functional group concentration within a particular distance of a sidewall (e.g., 2 nm or 3 nm) is not less than twice the concentration of the ligand or functional group at greater than the distance the from the sidewall (or at a center of the plug). In some embodiments, the ligand or functional group concentration monotonically increases from a sidewall of the ILD layer 401 to a center of plug 403.

In some embodiments, integrated circuit structure 400 includes a grating including any number parallel lines (please refer to grating 311 of FIG. 2), plug 403 extending between a first sidewall 411 of a first line 412 of the grating and a second sidewall 413 of a second line 414 of the grating (not shown in the top down view). For example, the grating may be a hardmask grating. Plug 403 includes bulk resist material 405 (e.g., any resist system of material(s) discussed herein including metal oxide cluster resist materials, inorganic cluster resist materials, chemically amplified resist materials, organic negative-tone scissionable resist materials, and others) and surface treatment material 406, materials released from surface treatment material 406, other additives, or the like as discussed further herein below. In some embodiments, plug 403 includes a bulk metal oxide cluster resist material and a molecule grafted to first sidewall 411 such that the molecule includes one of a cross-linking moiety, a capping agent, or an electron quencher as discussed further herein below.

As discussed with respect to FIG. 2, plugs 321 are patterned within grating 311. In some embodiments, plugs 321, plugs 403 or any other plugs discussed herein are patterned using a non-blurry metal oxide cluster based resist. Notably, state of the art non-blurry metal oxide resists provide acceptable critical dimension uniformity (CDU) in the unconfined direction (e.g., along the 1D grating) with no registration offset. However, such resists pattern 'triangles' with unacceptable CDU in the confined direction (e.g., across the 1D grating) with small registration offset.

Figure 4:
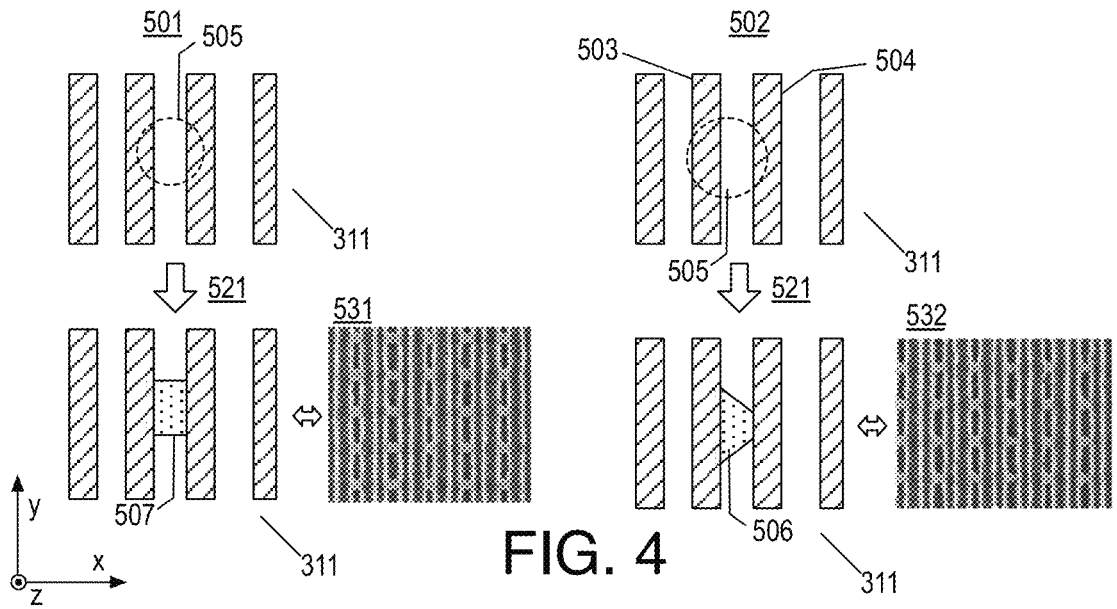
FIG. 4 illustrates example patterning with on-target alignment and example patterning with misalignment in a confined direction.

FIG. 4 illustrates example patterning with on-target alignment 501 and example patterning with misalignment 502 in the confined direction, arranged in accordance with at least some implementations of the present disclosure. As shown in FIG. 4, when misalignment 502 occurs (e.g., misalignment of about 2.5 nm) during EUV exposure 521 (or EUV patterning), a mask opening 505 be more closely aligned with a line 503 and may drift away from an adjacent line 504. Put another way, mask opening 505 may be closer to line 503 instead of a centerline between lines 503, 504, as is desired. As shown, during EUV patterning, such misalignment 502 causes a plug 506 having a triangular shape with misaligned edges in the confined direction (i.e., the direction orthogonal to the lines of grating 311) such that the edges tend to merge in the direction opposite the misalignment of mask opening 505, in contrast to plug 507. Such effects are also shown with respect to insert images 531, 532.

Figure 5:
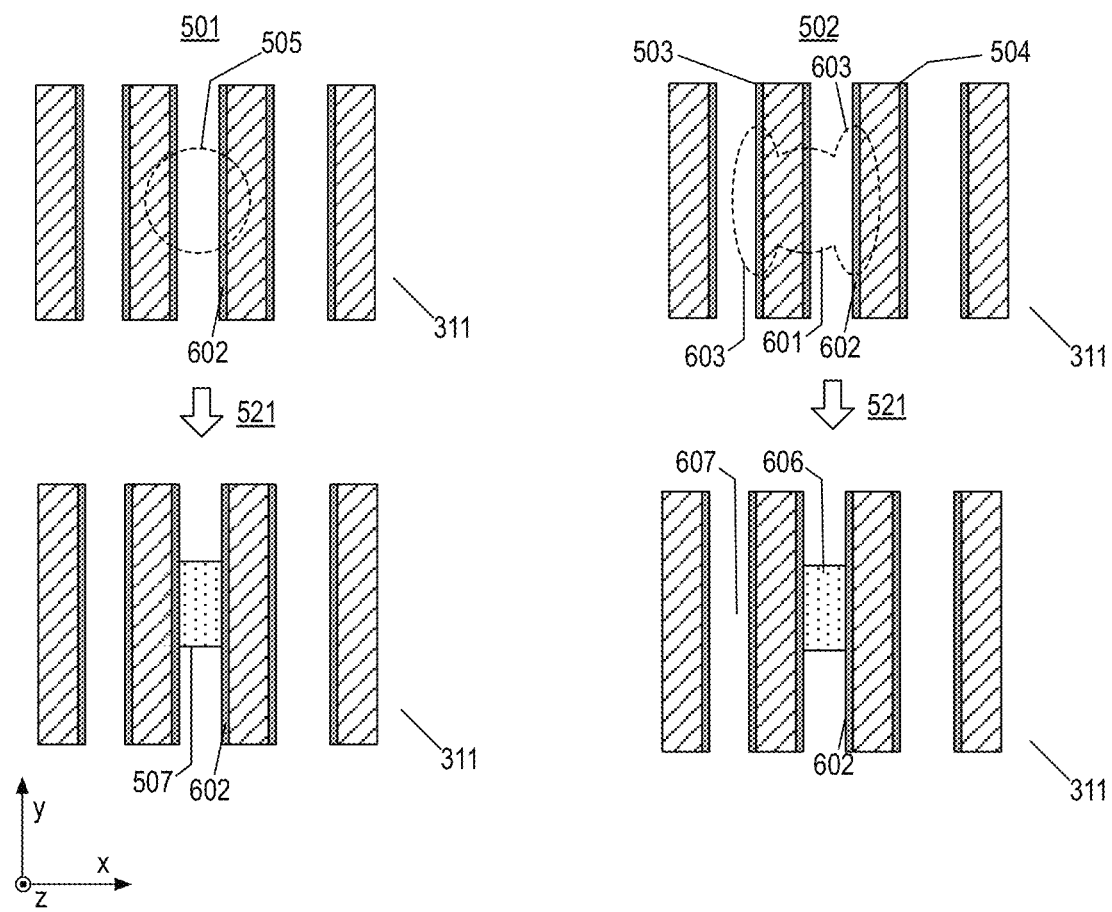
FIG. 5 illustrates an example hammerhead exposure feature and an example surface treatment to mitigate the effects of misalignment.

FIG. 5 illustrates an example hammerhead exposure feature 601 and an example surface treatment 602 to mitigate the effects of misalignment 502, arranged in accordance with at least some implementations of the present disclosure. As shown, in some embodiments, to improve patterning during misalignment 502 (e.g., a misalignment of about 8 nm may be tolerated), surface treatment 602 and hammerhead exposure feature 601 may be used together. Hammerhead exposure feature 601 includes exposure of the illustrated feature shape onto a resist layer and a mask used to generate hammerhead exposure feature 601 during EUV exposure 521 may have a similar feature. In some embodiments, surface treatment 602 and hammerhead exposure feature 601 may be used in conjunction with an optimized feature design on the mask to improve patterning. In some embodiments, surface treatment 602 and hammerhead exposure feature 601 may be used separately. As shown with respect to on-target alignment 501, plug 507 may be formed using mask opening 505, however surface treatment 602 and/or hammerhead exposure feature 601 may be needed during misalignment of a mask opening (refer to FIG. 4).

As shown, hammerhead exposure feature 601 includes serifs or protrusions 603 provided on constrained sides of hammerhead exposure feature 601. Notably, a mask may include a feature having or approximating the features of hammerhead exposure feature 601 and discussion of hammerhead exposure feature 601 applies to the mask used to generate (during exposure) hammerhead exposure feature 601 as well. Notably, hammerhead exposure feature 601 is absent protrusions in the unconstrained direction. As shown, in some embodiments, protrusions 603 have a length (in the unconstrained direction) that exceeds a length of feature 601 at a centerline (running in the unconstrained direction) of feature 601. Also as shown, in some embodiments, protrusions 603 expand, in the constrained direction, a circular portion of feature 601. For example, opening feature may include a circular center portion (or square on a mask) and additional protrusions 603 extending from the circular center portion. On the mask, such protrusions may be oval or rectangular or the like.

Hammerhead exposure feature 601 (or similar shaped features having protrusions 603) at the edges of lines 503, 504 allow more photons at edges of lines 503, 504 of the desired region to be plugged (e.g., the region extending between sidewalls or edges of lines 503, 504). To prevent patterning a plug in an undesired region 607 (e.g., to the left of line 503 where no plug is desired to formed) or to promote patterning plug 606, surface treatment 602 is applied to grating 311. In some embodiments, surface treatment 602 is a grafted quencher (discussed further below). A grafted quencher prevents or mitigates patterning in undesired region 607. However, surface treatment 602 may be a surface grafted cross-linker (to promote patterning plug 606), a surface grafted capping agent (to prevent or mitigate patterning in undesired region 607), or any other surface treatment discussed herein.

Two techniques involving surface treatment of incoming trenches prior to resist coating and exposure are described below. These techniques improve patterning performance of resist systems such as non-blurry inorganic cluster resists without compromising CDU either by preventing voids from forming (in a desired plug) or formation of slivers (in undesired regions) in adjacent trenches. The first techniques increase cross-linking of clusters selectively in an area of a trench (e.g., a region between two lines of a grating) receiving too low of a dose for full cross-linking to take place under normal conditions. This scenario may occur in conjunction with smaller glass size. The second techniques decrease cross-linking in an adjacent trench by selectively suppressing chemistry in the adjacent trench while still allowing for larger glass size to be used. Such techniques are complementary and may take advantage of similar surface grafting chemistry with differences in the nature of the chemistry revealed at the surfaces.

As discussed, plugs (e.g., plugs 321, plugs 606, etc.) may be patterned using a non-blurry metal oxide cluster based resist. A metal oxide resist may include (prior to exposure) a metal oxide core surrounded by covalently bonded ligands that allow the metal oxide core to be dissolved in a casting solvent. The metal oxide resist may be spin coated onto a grating. Under exposure, cross-linking chemistry occurs such that radicals generated by primary photons and secondary electrons cause cross-linking between the ligands themselves and/or the ligands can dissociate from the metal oxide core leaving an ionized or unsaturated portion of the metal oxide core (e.g., hydroxyl or other radical structure) that can cross link with another ionized or unsaturated metal oxide core of another cluster, causing a solubility switch. In developer, the unexposed clusters remain soluble in an organic solvent while exposed clusters are cross linked and are insoluble. In some embodiments, patterning of a non-blurry metal oxide cluster resist includes promoting cross-linking of the resist using a latent cross-linking moiety grafted on trench surfaces.

Figure 6:
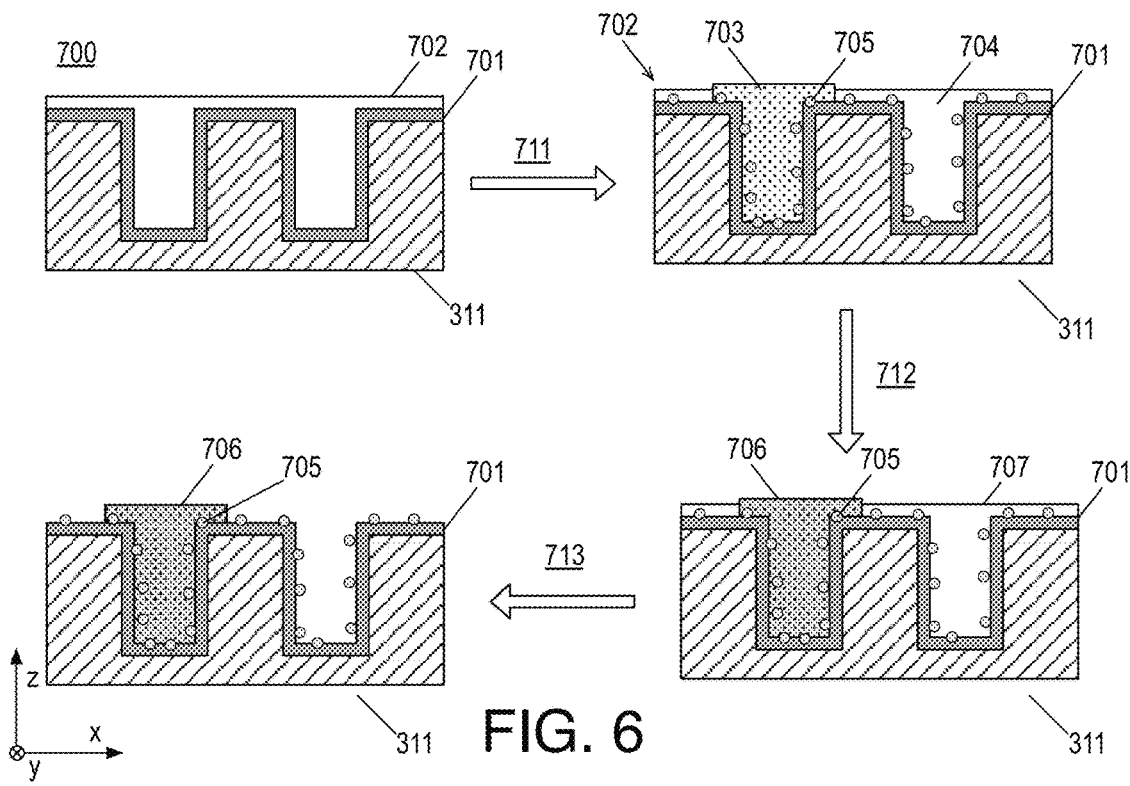
FIG. 6 illustrates an example EUV patterning process using a grafted latent cross-linking enhancement moiety on trench surfaces.

FIG. 6 illustrates an example EUV patterning process 700 using a grafted latent cross-linking enhancement moiety on trench surfaces, arranged in accordance with at least some implementations of the present disclosure. As shown in FIG. 6, process 700 includes receiving a grating 311, which may be any grating discussed herein, and applying a grafted latent cross-linking moiety surface treatment 701 on grating 311. In some embodiments, disposing surface treatment 701 includes deposition of a self-assembled or other type of monolayer. In some embodiments, disposing surface treatment 701 includes deposition of a short polymer brush. Surface treatment 701 may be grafted to grating 311 inclusive of sidewalls of lines of grating 311, tops of lines of grating 311, and/or a trench surfaces between lines of grating 311, or any combination thereof. As used herein, the term trench indicates a region between lines of a grating inclusive of sidewalls of two neighboring lines and the bottom surface between the lines.

Furthermore, a resist layer 702 such as a metal oxide cluster resist layer is formed over surface treatment 701 and grating 311 and provides a substantially planar exposure surface. In some embodiments, resist layer 702 is formed using spin coating of a wafer being processed via process 700. Surface treatment 701 improves patterning of a metal oxide cluster resist layer (e.g., of non-blurry metal oxide clusters) by grafting a latent cross-linking moiety on the surface of trenches of grating 311 such that the cross-linking moiety is released from the surface during EUV exposure or during UV flood exposure following the EUV exposure. The cross-linking moiety is then thermally diffused through the resist layer (e.g., film) but only reacts with clusters that have been activated by EUV photons or secondary electrons. In addition to ultimately setting the film rendering it insoluble, the cross-linking component or moiety also enhances blur especially where needed, at edge of trench most affected by overlay. Additionally, less activation of clusters is needed at trench edges due to higher concentration of cross-linker in this area.

For example, as shown, grating 311, surface treatment 701, and resist layer 702 are exposed (at exposure operation 711) causing patterning of resist layer 702. Furthermore, surface treatment 701 is activated either during EUV exposure (e.g., at exposure operation 711) or a subsequent UV flood exposure or both. For example, exposure (e.g., at exposure operation 711) may provide for an exposed portion of resist 703 and an unexposed portion of resist 704. Furthermore, surface treatment 701 activation causes cross-linking moieties 705 to be released. In the illustrated embodiment, cross-linking moieties 705 are released in exposed portion of resist 703 and unexposed portion of resist 704. In some embodiments, cross-linking moieties 705 are released only in exposed portion of resist 703 or more substantially in exposed portion of resist 703 due to release via EUV exposure.

As shown, during diffusion and cross-linking during a cross-linking bake 712 (or post exposure bake), exposed portion of resist 703 is cured to provide cured or insoluble resist portion 706 as influenced by cross-linking moieties 705. During cross-linking bake 712, unexposed portion of resist 704 does not cure or set and remains as soluble resist portion 707. Following cross-linking bake 712, a develop operation 713 removes soluble resist portion 707 while insoluble resist portion 706 (e.g., as a plug as discussed herein) remains. Although discussed with respect to plugs, blocks, etc., insoluble resist portion 706 and other resist features herein may have any size or shape such as line segments, rounded plugs, etc.

As discussed, surface treatment 701 and/or released cross-linking moieties 705 enhance cross-linking with respect to exposed portion of resist 703. Such enhanced cross-linking is due to reaction with metal oxide clusters that have been activated by EUV photons or secondary electrons. For example, released cross-linking moieties 705 may cause cross linking between activated (e.g., ionized or unsaturated) metal oxide clusters and/or between released radical ligands. The term cross-linking moiety indicates a molecule or functional group either as part of a larger grafted molecule or after release from the larger grafted molecule. For example, surface treatment 701 may include grafted molecules attached to grating 311 via one end of the molecules while another end or portion of the molecule includes a moiety or functional group capable, upon release, of enhancing cross-linking of a metal oxide cluster based resist.

Figure 7:
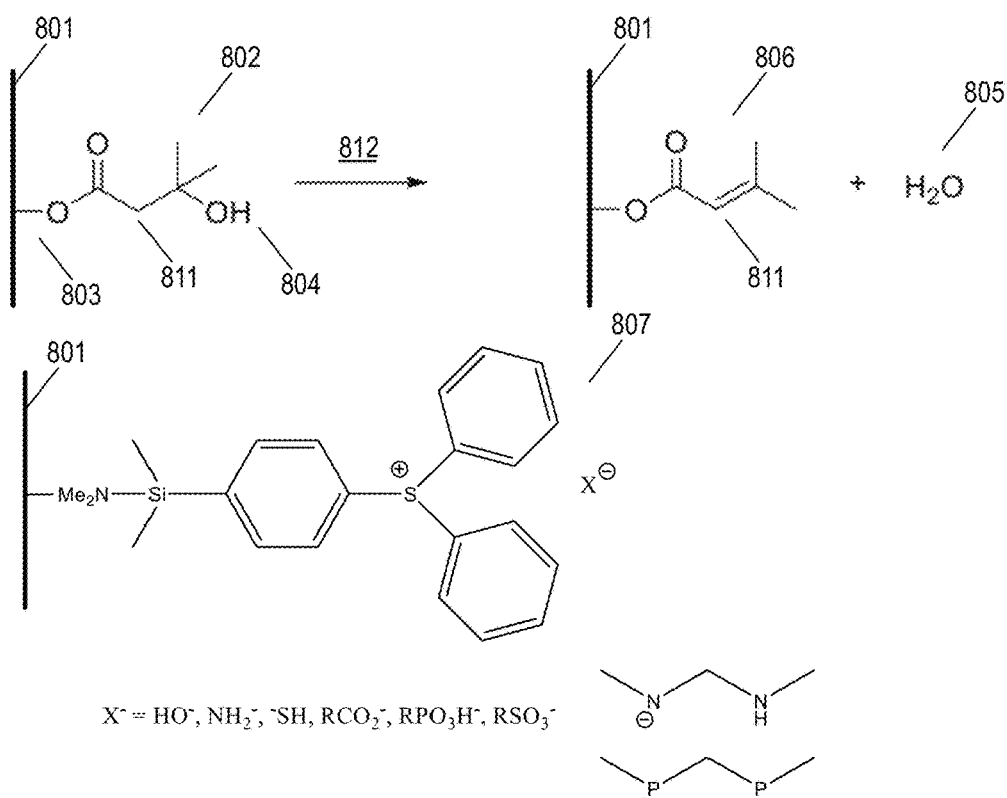
FIG. 7 illustrates an example surface treatment molecule grafted onto an example grating surface.
Figure 8:
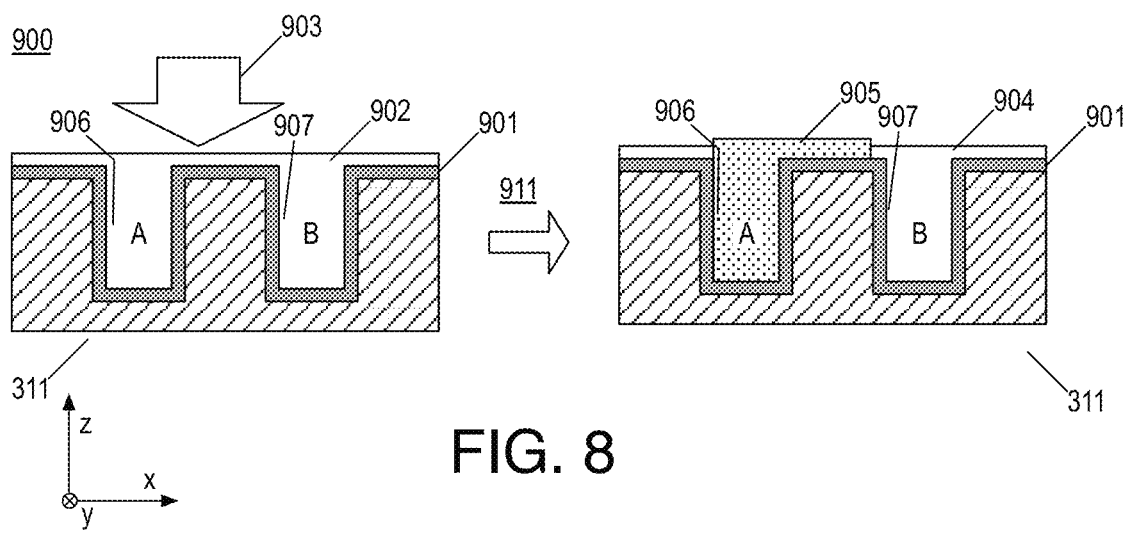
FIG. 8 illustrates an example EUV patterning process using a grafted cross-linking inhibitor on trench surfaces.

FIG. 7 illustrates an example surface treatment molecule 802 grafted onto an example grating surface 801, arranged in accordance with at least some implementations of the present disclosure. As shown in FIG. 7, molecule 802 includes a first end (or terminus) 803 coupled to grating surface 801 (which may be a top, sidewall, or trench bottom surface). Molecule 802 may be coupled to grating surface 801 using any suitable chemistry such as a covalent bond as shown. In some embodiments, molecule 802 is covalently bonded to grating surface 801 via an oxygen atom. Molecule 802 further includes a short organic chain 811 extending from first end 803 toward a second end thereof and inclusive of a cross-linking moiety 804 (e.g., a hydroxyl group). As shown with respect to release 812, upon release of a released cross-linking moiety 805 (or simply a cross-linking moiety or molecule), molecule 802 is reduced to molecule 806. Notably, release 811 may be due to EUV or UV exposure as discussed herein. Cross-linking moiety 805 (e.g., water in this example) is then released and diffused through the resist film to enhance cross linking. Another example of a grafting group is triarylsulfonium, as shown with respect to surface treatment molecule 807, where attachment occurs via aminosilane or other functionality reactive with surface 801. The sulfonium moiety is EUV or UV responsive and will release anion X— as conjugate acid XH following exposure, as shown in FIG. 8. Different X— groups may be employed where resulting acids can serve a cross-linking role as discussed.

In the illustrated embodiment, a water molecule (e.g., cross-linking moiety) is released to enhance cross linking. Furthermore, molecule 802 includes, after an oxygen atom covalent bond, a four carbon chain. Molecule 802 may include any length carbon chain and any suitable cross-linking moiety and modified cross-linking moiety released therefrom. In some embodiments, released cross-linking moiety 805 is water (as shown), carboxylic acid (bridging), sulfonic acid, phosphonic acid, an alcohol, an amine, a diamine, a diphosphine. That is, exemplary cross-linking groups that can be released (from molecule 802) include water, carboxylic acids (bridging), sulfonic and phosphonic acids, certain alcohols and amines, diamines, diphosphines and other nucleophilic molecules able to bridge two clusters or possessing two nucleophilic sites. Notably, at least some released cross-linking moiety 805 may remain in insoluble resist portion 706 (e.g., a plug).

With continued discussion with respect to metal oxide cluster resists, in some embodiments, instead of enhancing cross-linking in regions where exposure may be less than desired, cross-linking is inhibited or eliminated in resist regions where undesired exposure occurred.

Figure 9:
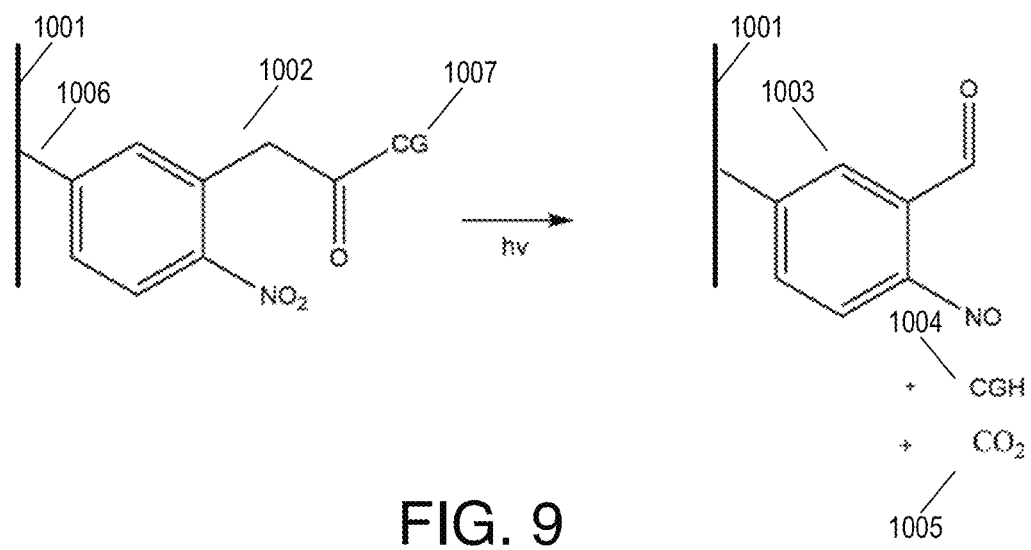
FIG. 9 illustrates an example surface treatment molecule grafted onto an example grating surface.

FIG. 8 illustrates an example EUV patterning process 900 using a grafted cross-linking inhibitor on trench surfaces, arranged in accordance with at least some implementations of the present disclosure. As shown in FIG. 9, process 900 includes receiving a grating 311 and applying a grafted cross-linking inhibitor surface treatment 901 on grating 311. In some embodiments, disposing surface treatment 901 includes deposition of a self-assembled or other type of monolayer. In some embodiments, disposing surface treatment 901 includes deposition of a short polymer brush. Surface treatment 901 may be grafted to grating 311 inclusive of sidewalls of lines of grating 311, tops of lines of grating 311, and/or a trench surfaces between lines of grating 311, or any combination thereof. Furthermore, a resist layer 902 such as a metal oxide cluster resist layer is formed over surface treatment 901 and grating 311 and provides a substantially planar exposure surface. Grafted cross-linking inhibitor surface treatment 901 may be a surface grafted capping agent including Lewis bases or a surface grafted electron quencher, examples of which are discussed in turn beginning with surface grafted capping agents.

In the context of FIG. 8, it is desirable to stop or hinder cross-linking chemistry from occurring in a neighboring trench while opening up a mask to ensure all material is cross-linked where targeted (please refer to FIGS. 4 and 5). For example, without hindering cross-linking, slivers of cross-linked material are generated in an adjacent trench when overlay is not ideal (e.g., in undesired region 607). In some embodiments, cross-linking chemistry is mitigated by incorporating photo-generated or photo-releasable ligands from a surface that react with activated clusters to cap or neutralize it and prevent cross-linking during subsequent processes such as post-exposure bake.

In some embodiments, surface treatments as discussed with respect to FIGS. 6 and 7 are used to provide surface treatment 901 (e.g., deposition of a self-assembled monolayer, deposition of a short polymer brush, covalent bonding to the trench surface, etc.). However, in contrast to cross-linking enhancement, in the context of FIG. 8, the released molecule is mono-functional preventing bridging or other cross-linking interactions from occurring in resist layer 902. In some embodiments, a bonding of a molecule to an activated metal center is such that subsequent displacement by water or another cross-linking molecule cannot take place during post-exposure bake or development. In some embodiments, the molecule that impedes cross-linking is released during the EUV exposure to allow differentiation between a left side of trench A 906 and a left side of trench B 907. For example, with overlay error (or extreme overlay error) in EUV exposure 903, more photo-released capping agent will be created in left side of trench B 907 than in the left side of trench A 906, causing the shutting down of cross-linking in trench B (due to surface treatment 901) but not in trench A. At other locations in trench A (e.g., near the right side of trench A), more photons overall are delivered via EUV exposure 903 since it is centered in an exposure area, thereby overcoming the impact of capping agents released in trench A. That is, although grafted cross-linking inhibitor surface treatment 901 partially inhibits cross-linking in trench A, the effect is overcome and a substantially exposed portion of resist 905 is provided. However, in the left side of trench B 907, an outer portion of low exposure (due to overlay) is provided and grafted cross-linking inhibitor surface treatment 901 inhibits cross-linking such that a substantially unexposed portion of resist 904 is provided.

Following EUV exposure 903 as show with respect to operation 911, process 900 may continue as discussed with respect to process 700 such that substantially exposed portion of resist 905 is cured and remains after a develop operation and substantially unexposed portion of resist 904 is removed during the develop operation. It is noted that the resultant plug established by substantially exposed portion of resist 905 includes cross-linking inhibitor surface treatment 901 and any moieties, functional groups, or molecules released during EUV exposure 903 and subsequent processing.

To achieve the discussed metal oxide based resist cross-linking inhibition via surface grafted capping agent, photolabile surface grafted capping ligands may be used. In some embodiments, the surface grafted molecule includes nitrobenzyl or a nitrobenzyl group. In some embodiments, the surface grafted molecule includes hydroxyphenacyl or a hydroxyphenacyl group.

For example, nitrobenzyl groups may be used as photosensitive protecting groups for a wide variety of potential capping groups including alkoxides, thiolates, phenolates, carboxylates, carbonates, and carbamates. As discussed with reference to Reaction Chemistry R1-R4 below, undesired exposure of the resist occurs due to EUV exposure in trench B (e.g., at the left side of trench B 907), for example, to create an activated resist site (R1). In the same local area, after sensitization due to recombination of EUV excited secondary electrons or off-band radiation, the surface grafted protecting group (e.g., surface grafted capping agent) decomposes to a nitrosobenzaldehyde, a released $CO_2$ molecule, and a protonated form of the protected group (R2). For non-blurry resists, nucleophilic capping groups such as carboxylates and alkoxides quench activated sites on the resist (R3) thereby reducing cross-linking.

Reaction Chemistry R1-R4

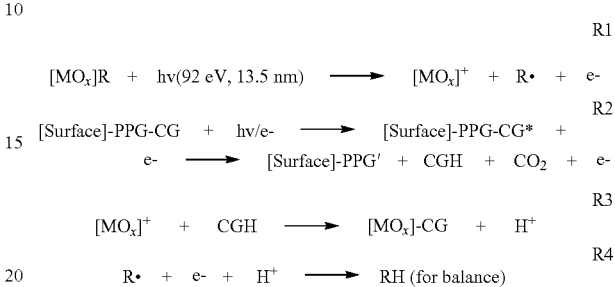

FIG. 9 illustrates an example surface treatment molecule 1002 grafted onto an example grating surface 1001, arranged in accordance with at least some implementations of the present disclosure. For example, FIG. 9 illustrates reaction R2 using a nitrobenzyl or nitrobenzyl group as a photosensitive protecting group and any capping group as an example. As shown, molecule 1002 may be covalently bonded to grating surface 1001 at a first terminus 1006 coupled to grating surface 1001 (which may be a top, sidewall, or trench bottom surface). Molecule 1002 may be coupled to grating surface 1001 using any suitable chemistry such as a covalent bond as shown. Molecule 1002 further includes an organic chain inclusive of a nitrobenzyl or nitrobenzyl group (e.g., a photosensitive protecting group, PPG) in the illustrated example leading to a capping group (CG) 1007. In the reaction (R2), grafted molecule 1002 releases capping group 1007 as reacted and modified by a hydrogen atom 1004 and grafted molecule 1002 is modified to grafted molecule 1003 (e.g., PPG'). Furthermore, reaction (R2) releases a $CO_2$ molecule 1005 and an electron as discussed above. As discussed, molecule 1002 (e.g., a capping agent grafted molecule) includes a photosensitive protecting group and capping agent or capping group 1007, the capping agent or group may include any suitable capping group such as an alkoxide, a thiolate, a phenolate, a carboxylate, a carbonate, or a carbamate. Furthermore, the photosensitive protecting group may include a nitrobenzyl or a nitrobenzyl group, a hydroxyphenacyl or a hydroxyphenacyl group, or others.

Figure 10:
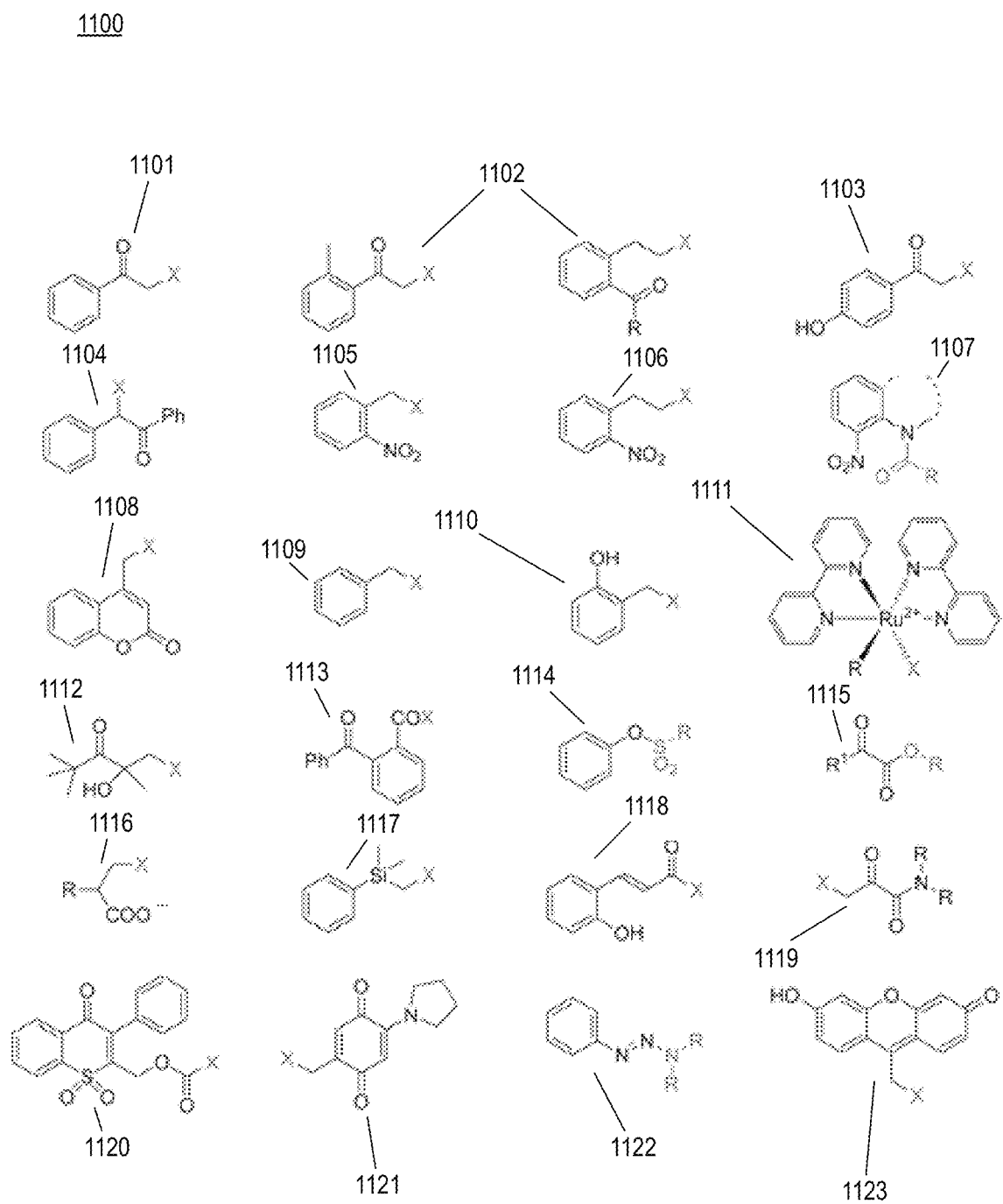
FIG. 10 illustrates example photosensitive protecting groups.

FIG. 10 illustrates example photosensitive protecting groups 1100, arranged in accordance with at least some implementations of the present disclosure. As shown, the photosensitive protecting group as employed above may include any of the following: phenacyl & arylcarbonylmethyl groups 1101, o-alkylphenacyl groups 1102, p-hydroxyphenacyl groups 1103, benzoin groups 1104, o-nitrobenzyl groups 1105, o-nitro-2-phenethyloxycarbonyl groups 1106, o-nitroanilides 1107, coumarin-4-ylmethyl groups 1108, arylmethyl groups 1109, o-hydroxyarylmethyl groups 1110, metal-containing groups 1111, pivaloyl groups 1112, esters of carboxylic acids 1113, arylsulfonyl groups 1114, ketones: 1,5- and 1,6-hydrogen groups 1115, carbanion-mediated groups 1116, sisyl & si-based groups 1117, 2-hydroxycinnamyl groups 1118, a-keto amides, α,β-unsaturated anilides, and methyl(phenyl)thiocarbamic acid 1119, thiochromone s,s-dioxide 1120, 2-pyrrolidino-1,4-benzoquinone groups 1121, triazine and arylmethyleneimino groups 1122, or xanthene and pyronin groups 1123. The capping group employed with such photosensitive protecting groups may be any discussed herein such as an alkoxide, a thiolate, a phenolate, a carboxylate, a carbonate, or a carbamate.

In addition, grafted sulfonium salts analogous to those described earlier can be used where the anion X— portion include carboxylic acids, alcohols, phenols, amines, thiols and other bases which cannot participate in cross-linking reactions due to presence of only one nucleophilic site, steric or other reactivity limitations.

With continued reference to FIG. 8 and grafted cross-linking inhibitors for metal oxide based resists, in some embodiments, a surface grafted electron quencher (radical/anion generators) may be employed as grafted cross-linking inhibitor surface treatment 901. In the context of surface grafted electron quenchers, techniques discussed herein selectively prevent cross-linking from occurring in trench B vs. A when overlay error occurs (e.g., when overlay error is highest). In some embodiments, photo-activated electron traps are added to the surface of grating 311 to competitively consume electrons generated in this area. The reduced species (examples are provided below) lead to release of radical and/or anionic/basic species that diffuse from the surface of grating 311 to activated clusters (e.g., metal oxide clusters of the resist) to halt or slow subsequent cross-linking (in a similar manner to that discussed with respect to capping agents).

In some embodiments, the surface grafted electron quenchers include sulfonium and other redox active onium salts, electron-deficient arenes (e.g. nitroarenes), alkenes substituted with multiple electron withdrawing groups (e.g. Tetracyanoethylene (TCNE) analogs), or inorganic elements in higher oxidation states. As discussed, in some embodiments, the electron quenchers are surface grafted for example in a manner analogous to that described earlier for sulfonium salts via reaction of surface with aminosilane or other reactive group. In some embodiments, the discussed electron quenchers may be free in the resist and may be included as an additive.

For example, as shown with reference to Reaction Chemistry R5-R8 below, a surface grafted or free quencher consumes free electrons (R5). In this example, the R group on the sulfonium triflate quencher produces a stable radical to promote the rearrangement shown in R6. R7 shows that the R' radical quenches the live radical formed by photoionization of the resist in R1 (referring to Reaction Chemistry R1-R4 illustrated above) and the remaining triflate anion can form an ion pair with the [MOx]+ cation until it can be reduced by electron recombination or chemically quenched. Anions other than triflate can also be used such as those described previously allowing range of different basicity to be employed and thereby different capping propensities.

Reaction Chemistry R5-R8

R5

R6

R7

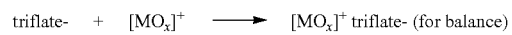

R8

In another embodiment, electron and radical trapping is provided by a redox reagent such as benzoquinone. Again, R1 shows the EUV induced photoionization of the metal oxide resist material which generates a [MOx]+ cation and R radical species. Free, or surface grafted benzoquinone (or another redox reagent) can capture a free thermalized secondary electron (forming a semiquinone radical anion) that then binds to the metal oxide cation. The resulting radical species can then quench the remaining R. radical thereby capping (or quenching) the reactive metal oxide site.

Figure 11:
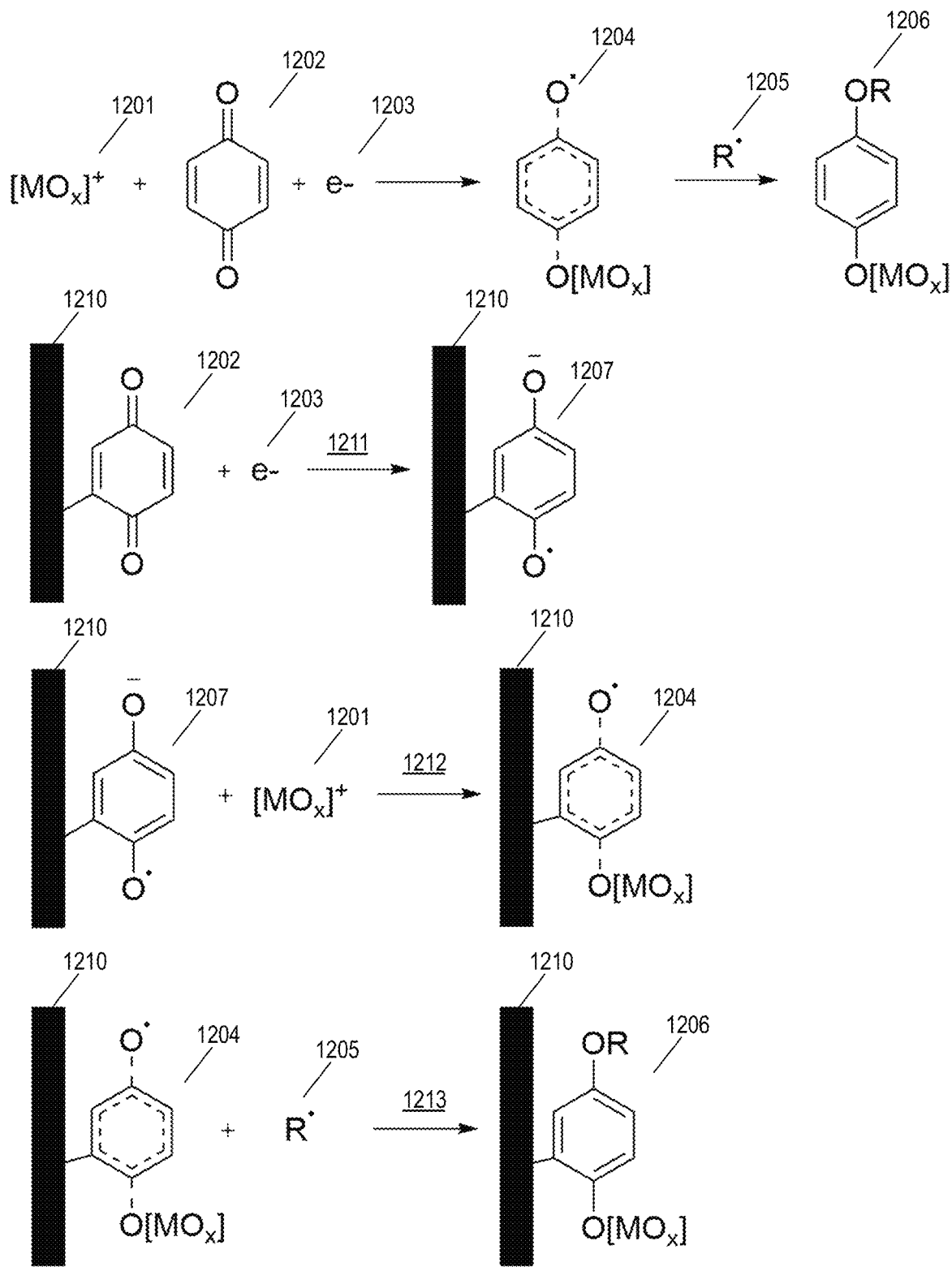
FIG. 11 illustrates example electron and radical trapping using benzoquinone.
Figure 12:
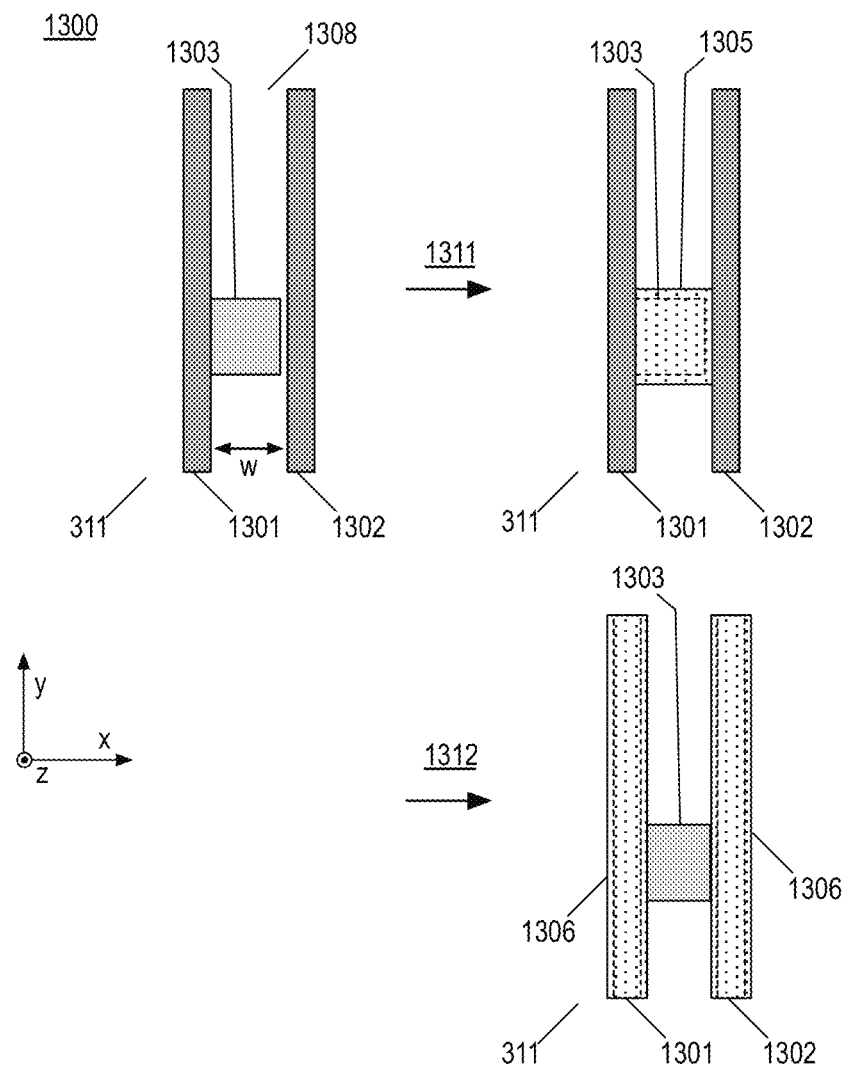
FIG. 12 illustrates exemplary plug healing.

FIG. 11 illustrates example electron and radical trapping using benzoquinone, arranged in accordance with at least some implementations of the present disclosure. As shown, a metal oxide cation 1201 may be produced in an activated resist (e.g., via activation from a photon or secondary electron). The resist further includes benzoquinone 1202, which may be provided as an additive in the resist or may be released from a surface grafted molecule. Although illustrated with respect to benzoquinone 1202, any suitable electron quencher may be employed. Furthermore, FIG. 12 illustrates such mechanisms with respect to surface grafted benzoquinone 1202 grafted to an example surface 1210, which may be any grating surface or the like discussed herein. In some embodiments, the grafting is provided via a TMS-O— linkage to one double bond to enable grafting to a chlorine terminated surface.

As shown, benzoquinone 1202 captures or traps an electron 1203 (e.g., a secondary electron generated via EUV radiation) and an activated metal oxide cation 1201 to form a molecule 1204 comprising metal oxide cation 1201 bonded to an oxygen atom, which is in turn bonded to a benzene ring. Opposite the bonded oxygen atom bonded to metal oxide cation 1201, is a second oxygen atom (that is radicalized). For example, as shown with respect to reaction 1211, benzoquinone 1202 captures or traps electron 1203 to form activated benzoquinone 1207. Furthermore, as shown with respect to reaction 1212, activated benzoquinone 1207 captures or traps activated metal oxide cation 1201 to form molecule 1204. As shown, the chemistry continues with capture of a radical group 1205, which is covalently bonded to the oxygen atom opposite the oxygen atom bonded to metal oxide cation 1201, to provide a molecule 1206 including a captured or trapped metal oxide cation 1201 and a captured or trapped radical group 1205. Such capture or trapping inhibits cross linking in a metal oxide cluster resist system as discussed herein. For example, as shown with respect to reaction 1213, molecule 1204 captures or traps radical group 1205 to form surface grafted molecule 1206.

In some embodiments, a plug as discussed herein includes an additive such as an electron quencher. In some embodiments, the plug includes a molecule including a trapped metal oxide cation and a trapped radical group. In some embodiments, the molecule comprises the metal oxide cation covalently bonded to a first oxygen atom, a radical group covalently bonded to a second oxygen atom, and a benzene ring bonded to the first oxygen atom at a first position of the benzene ring and bonded to the second oxygen atom at a second position of the benzene ring opposite the first position.

In some embodiments, the resist used herein (e.g., resist layer 702 or resist layer 902) may be a non-blurry inorganic cluster resist and additives may be added to the resist for improved cross linking. Such embodiments may be used in conjunction with the discussed surface grafted techniques or they may be employed separately. In some embodiments, additive that decrease Tg (glass transition temperature) of the resist film and provides cross-linking moieties to react with activated metal centers of clusters (as discussed herein) may be added to an EUV photoresist composition. The EUV photoresist composition may then be employed as discussed herein with use of a grating or directly onto a planar surface. For example, an EUV photoresist composition including an electron quencher (as discussed above), a cross linking moiety, or any other additive discussed herein may be employed as resist layer 702 (with or without surface treatment 701), or resist layer 902 (with or without surface treatment 901), as any other resist layer discussed herein, or as a resist layer processed over a planar surface (e.g., absent grating 311).

In the context of cross linking moiety additives, such additives may be advantageous in the context of small glass size where photon spillover to adjacent trenches is not occurring or is at least limited. In some embodiments, the cross linking moiety additive may be selected as a low molecular weight (MW) additive that promotes cross linking as discussed herein. In some embodiments, an EUV photoresist composition or EUV resist includes a plurality of inorganic clusters and an additive. In some embodiments, the additive is an electron quencher (as discussed above). In some embodiments, the additive is a cross linking moiety. In some embodiments, the cross linking moiety is one of polyvinylalcohol, polyvinylpyridine, a polyacrylic acid, a polyhydroxystyrene, or any multifunctional molecule where nucleophilic functionality (e.g. alcohol, pyridine, carboxylic acid, etc.) does not react with the inorganic cluster in solution or thin film unless the inorganic cluster (e.g., tin cluster) has been activated by EUV photons to create reactive sites susceptible to attack by the nucleophiles. In some embodiments, the additive includes one of polyvinylalcohol, polyvinylpyridine, polyacrylic acid, polyhydroxystyrene, or pyridine. In some embodiments, the additive includes a cross linking moiety including a molecule having an alcohol group or a carboxylic acid group.

In some embodiments, the cross-linking groups (e.g., additives) are introduced in latent form requiring EUV activation to release active functionality. Such embodiments enhance or maintain high contrast in the resist system. In some embodiments, deposition techniques like CVD are employed to create a composition or EUV absorbance gradient in the resist.

FIG. 12 illustrates exemplary plug healing 1300, arranged in accordance with at least some implementations of the present disclosure. As shown, in some embodiments, a plug 1303 is formed that does not extend across an entirety of the trench between lines 1301, 1302 of grating 311. Although shown as against line 1301, in some embodiments, plug 1303 is not against either of lines 1301, 1302 and is instead free-standing in the trench between lines 1301, 1302. In some embodiments, plug healing 1300 provides a post-litho healing process to heal small and/or misaligned plugs such that a resultant structure spans the entirety of the trench. In some embodiments, a surface pretreatment with UV light and at high temperature is employed to render plug 1303 either a target for or inhibited against selective deposition of selective coating. In some embodiments, plug 1303 comprises tin oxide (SnOx), which may be treated to be a target for or inhibited against the selective deposition of titanium nitride. For example, in the use case of a mis-registered plug 1303 not spanning the width, w, of a trench 1308, a selective atomic layer deposition is applied to grow plug with a coating 1305 of TiN, for example, to span the trench as illustrated with respect to processing 1311. Such techniques advantageously close off the line end and prevent shorts.

Alternatively, as illustrated with respect to processing 1312, lines 1301, 1302 of grating 311 are selectively grown outwards to meet the plug using a similar ALD approach to provide a coating 1306 (e.g., of TiN). Such selective deposition of TiN onto the grating (e.g., an oxide grating) grows sidewalls of lines 1301 out to contact and seal off the trench end against plug 1303 (e.g., a SnOx plug) while maintaining the small size advantages of plug 1303 (as provided via, for example, SnOx resist technology). Such selective deposition (e.g., via ALD) may be provided as shown with respect to processing 1311 or 1312 to overcome limitations of inorganic resists such as SnOx resists with selective deposition to ensure that line ends are uniformly effective at isolating metal lines despite small shifts in layer registration.

In some embodiments, as discussed herein, metal lines (e.g., interconnects) are formed in the remaining trenches. Such metal lines interconnect devices (e.g., transistors, etc.) of an integrated circuit. In some embodiments, with reference to processing 1311, an integrated circuit includes grating 311 including a number of parallel lines, plug 1303 between a first sidewall of line 1301 and a second sidewall of line 1302, the plug comprising a bulk resist material such as a SnOx resist, coating 1305 on plug 1303 but absent lines 1301, 1302 at top surfaces, and other surfaces not contacted by the growth of coating 1305 on plug 1303, the coating 1305 extending from plug 1303 to at least the second sidewall of line 1302 (and optionally the first sidewall of line 1301 when the plug is not initially in contact with first sidewall of line 1301), and a metal line (not shown) extending between the first sidewall of line 1301, the second sidewall of line 1302, and a portion of the coating on a third sidewall of plug 1303 (e.g., a sidewall of plug 1303 in the x-z plane).

In some embodiments, with reference to processing 1312, an integrated circuit includes grating 311 including a number of parallel lines, plug 1303 between a first sidewall of line 1301 and a second sidewall of line 1302, the plug comprising a bulk resist material such as a SnOx resist, coating 1306 on the lines 1301, 1302 and absent at least a top surface of plug 1303 (and surfaces not contacted by the grown of coating 1306), coating 1306 extending from at least the second sidewall of line 1302 to plug 1303, and a metal line (not shown) extending between coating 1306 on the first and second sidewalls of lines 1301, 1302, respectively, and a third sidewall of plug 1303 (e.g., a sidewall of plug 1303 in the x-z plane).

As discussed, in some embodiments, blurry metal oxide resist systems may be employed. Notably, current blurry metal oxide resists have an acceptable overlay window of +/−8 nm but suffer from poor CDU in the unconfined direction.

Figure 13:
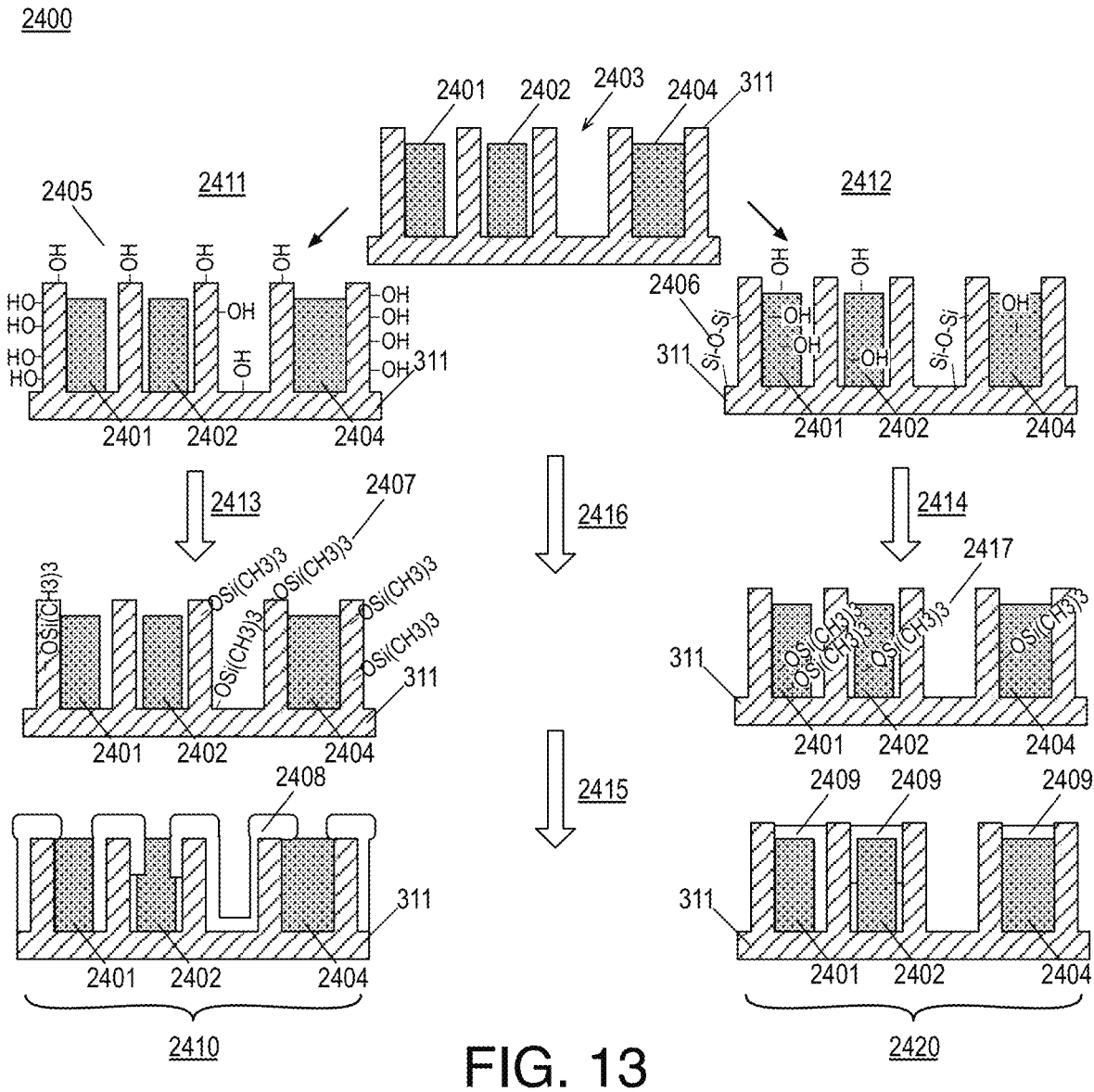
FIG. 13 illustrates exemplary processing for plug healing.

FIG. 13 illustrates exemplary processing 2400 for plug healing, arranged in accordance with at least some implementations of the present disclosure. FIG. 13 illustrates four resultant plug cases drawn for resist patterning inside a grating such as grating 311. For example, four cases for resultant plugs from resist patterning inside grating 311 are shown. Resultant plug 2401 shows a partial span (e.g., a plug in contact with a sidewall of one line but absent a sidewall of an adjacent line and instead extending only partially across the corresponding trench), resultant plug 2402 shows an island (e.g., a plug in contact with neither line sidewall and isolated in the corresponding trench), result 2403 shows a missing plug (e.g., no plug formed), and resultant plug 2404 shows a complete span (e.g., a plug that spans the trench and is in contact with sidewalls of both adjacent trenches).

Treatment is then applied with UV-light to cure the resist and heat is applied to oxidize either SiO2 gratings 311 to form surface reactive silanol groups or the Sn oxide resist of plugs 2401, 2402, 2404 to form tin hydroxide. The UV and bake (e.g., simultaneous bake and UV cure) modifies the surface materials. As shown with respect to UV cure and bake 2411, a lower temperature bake (e.g., about 180° C. such as a bake in the range of 170° C. to 190° C.) favors Si—OH formation 2405 while higher temperature bake, as shown with respect to UV cure and bake 2412 (e.g., a bake at about 450° C. such as a bake in the range of 425° C. to 475° C.), leads to more Si—O—Si bonds 2406. Notably, —OH groups are reactive to the passivation chemical dimethylamino trimethylsilane (DMA-TMS). As shown in FIG. 13, two processing paths 2410, 2420 are thereby provided. Processing path 2410 extends from UV cure and bake 2411 and path 2420 extends from UV cure and bake 2412 with each path sharing processing subsequent to UV cure and bake 2411 and UV cure and bake 2412. Processing path 2410 is used for plug healing by providing a material on lines of grating 311 while processing path 2420 is used for perform plug healing by providing a material on plugs 2401, 2402, 2404.

As shown, DMA-TMS treatment 2416 is then performed in either case (e.g., for either processing path 2410 or processing path 2420). For example, the DMA-TMS treatment 2416 may be a 5 min exposure to 3:2 TMA-DMS/N2. As shown with respect to DMA-TMS treatment 2413 and DMA-TMS treatment 2414, the DMA-TMS treatment reacts with surface —OH groups to form —OSi(CH$_3$)$_3$ at the surfaces having —OH groups or rich in such —OH groups. For example, such reaction chemistry forms a covalent bond via the oxygen atom to a trimethylsilane group. In the context of low temperature bake (as discussed above), the —OSi(CH$_3$)$_3$ groups 2407 are provided on the lines of grating 311 (e.g., on SiO2. In the context of high temperature bake (as discussed above), the —OSi(CH$_3$)$_3$ groups 2417 are provided on the resultant plugs 2401, 2402, 2404 of resist material (e.g., on Sn oxide).

As shown, processing continues in either case with titanium nitride atomic layer deposition (TiN ALD) 2415 using Ti(Cl)$_4$/NH$_3$ chemistry. As shown, in the context of the low temperature bake of processing path 2410, a titanium nitride coating 2408 is formed selectively on the lines of grating 311 (e.g., via the —OSi(CH$_3$)$_3$ groups thereon). In the context of high temperature bake of processing path 2420, a titanium nitride coating 2409 is formed selectively on plugs 2401, 2402, 2404 (e.g., via the —OSi(CH$_3$)$_3$ groups thereon).

By performing selective ALD as discussed, areas of the pattern where a Sn-based photoresist does not completely span the width of a trench of grating 311 may be recovered as shown with respect to plugs 2401, 2402 and either titanium nitride coating 2408 or titanium nitride coating 2409 providing a span between lines of grating 311 where plugs 2401, 2402 alone failed to span between lines of grating 311.

Figure 14:
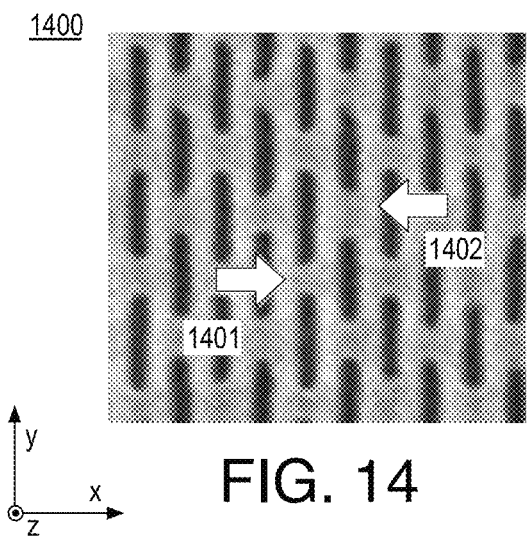
FIG. 14 illustrates an example blurry resist SEM illustrating poor CDU in an unconfined direction.

FIG. 14 illustrates an example blurry resist SEM 1400 illustrating poor CDU 1401, 1402 in the unconfined direction (e.g., y-direction), arranged in accordance with at least some implementations of the present disclosure. Techniques discussed herein improve CDU in the unconfined direction (e.g., y-direction) such as reducing or eliminating poor CDU 1401, 1402 in blurry metal oxide resist systems as well as providing other benefits.

In some embodiments, blurry inorganic cluster resists are improved by adding radical scavenging additives. In some embodiments, additives that capture reactive radicals that propagate the cross-linking chain reaction (of the blurry inorganic cluster resists) increase the contrast of blurry resists. It is noted that use of these additives may have the detrimental effect of increasing the dose to cure, which may be counteracted by a post-exposure bake that uses water to promote condensation reactions between [HfOx]+ sites).

Figure 15:
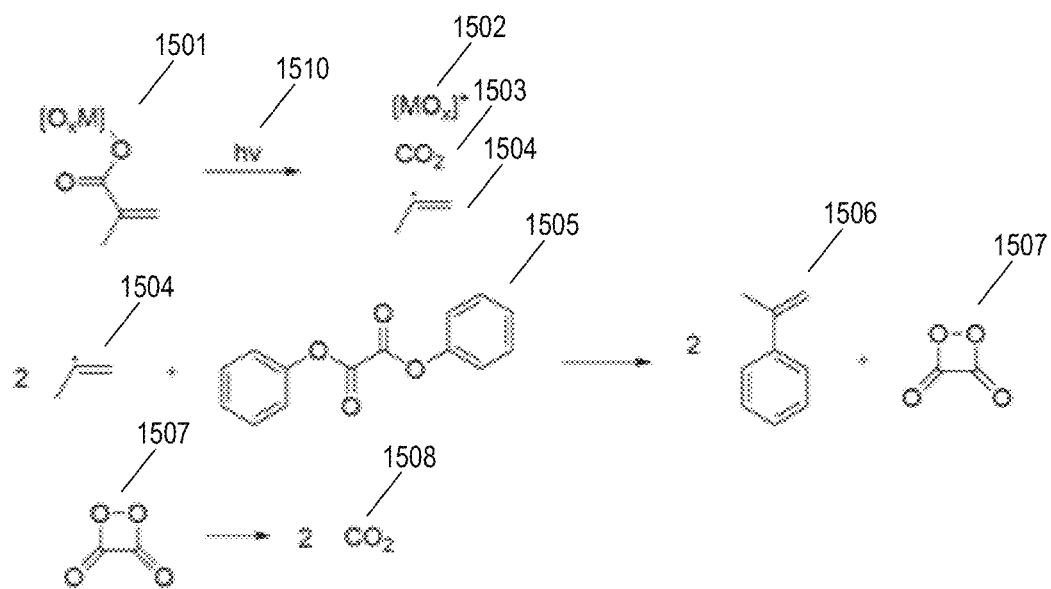
FIG. 15 illustrates example reactive radical capture using a radical scavenging additive in a blurry inorganic cluster resist.

FIG. 15 illustrates example reactive radical capture using a radical scavenging additive in a blurry inorganic cluster resist, arranged in accordance with at least some implementations of the present disclosure. As shown, a metal oxide resist cluster 1501 is activated by EUV exposure (hv) 1510 to generate a metal oxide cation 1502, a carbon dioxide molecule 1503, and a radical 1504 such as a propenyl radical, which may be characterized as an initiator radical as it functions to activate other metal oxide resist clusters in the cross linking of the blurry inorganic cluster resist.

Furthermore, two radicals 1504 react with a radical scavenging additive 1505 (in the illustrated example radical scavenging additive 1505 is diphenyl oxalate) to form inactive molecules a-methylstyrene 1506 and 1,2-dioxetanedione 1507. As shown, inactive molecule 1507 may dissociate to form two carbon dioxide molecules 1508.

For example, one equivalent of diphenyl oxalate can trap two propenyl radicals that are generated from the EUV exposure of a blurry inorganic cluster resist such as hafnium oxide-methyl acrylate type blurry resists. In some embodiments, the remaining [HfOx]+ sites are reduced by secondary electrons or they participate in condensation reactions with water in a post-exposure bake.

Although illustrated with respect to diphenyl oxalate, any suitable radical scavenger or radical scavenging molecule may be employed. In some embodiments, the radical scavenger or radical scavenging molecule is one of tetramethylpyrrolidine-N-oxide (TEMPO), a derivate of tetramethylpyrrolidine-N-oxide, 1,1-diphenylethene, a 1,1-diphenylethene related alkene trap, substituted 1,4-cyclohexadiene, an H-atom donating organic species, tris-trimethylsilylsilane (Me3Si)3SiH, an H-atom donating main group complex, butylated hydroxytoluene (BHT), or a phenolic compound related to butylated hydroxytoluene.

In other embodiments, photoradical generators (PRG) are employed where EUV exposure creates radicals from both a hafnium carboxylate cluster (of the blurry inorganic cluster resist) and the photoradical generators. In some embodiments, the photoradical generators include one of sulfonium salts (e.g., which are known to release alkyl or aryl radicals as described earlier), disilanes (R3Si—SiR3), or bis-stannanes (e.g., Bu3SnSnBu3). In some embodiments, the characteristics of the radicals generated may be tuned to favor reactions of other radicals as opposed to initiating new reactions via reaction with methacrylate ligands.

In some embodiments, blurry inorganic cluster resists are improved by altering their molecular design. Notably, blurry metal oxide resists are cured via EUV-initiated radical chain reaction. This reaction is initiated by small radical species such as propenyl radicals. The chain reaction then propagates as neighboring cluster sidechains are cross-linked. It is terminated by the quenching of two radical species.

In some embodiment, crosslinking in blurry inorganic cluster resists (which causes low contrast or blurriness) is limited using molecular design as follows. In some embodiments, ligands susceptible to crosslinking are substituted with those that are not. For example, alkylcarboxylic and arylcarboxylic acids like pivalic acid, isobutyric acid, and benzoic acid ligands may be employed. In some embodiments, pentafluorobenzoic acid may be used where activated ligand can still initiate radical reaction but does not provide site for direct cross-linking. In some embodiments, an EUV photoresist composition (e.g., a dispensable photoresist for application to a wafer in EUV photolithography processing in any context such as those discussed herein) includes a solvent and inorganic clusters dispersed in the solvent. In some embodiments, the inorganic clusters each (or at least some) include a plurality of ligands. In some embodiments, the ligands include one of alkylcarboxylic acid, arylcarboxylic acid, pivalic acid, isobutyric acid, or benzoic acid, or pentafluorobenzoic acid. Other ligands of each inorganic clusters may include those known in the art.

In some embodiments, the ligands are changed to bulkier slow diffusing ligands (or molecules to limit diffusion of radical species. For example, ligands having main carbon chains of not fewer than five carbon atoms may be employed.

In some embodiments, radical trapping ligands are incorporated into the resist molecules. In some embodiments, the radical trapping ligands are incorporated into an arylcarboxylic acid as a substituent on the benzene ring. In an embodiment, the radical trapping ligand is 4-Me3SiSiMe2-C6H4-CO2H where disilane moiety serves as source of Me3Si radical. In some embodiments, an EUV photoresist composition includes a solvent and inorganic clusters dispersed in the solvent, the inorganic clusters each (or at least some) including a radical trapping ligand incorporated into an arylcarboxylic acid as a substituent on a benzene ring of the first inorganic cluster. In some embodiments, the radical trapping ligand comprises 4-Me3SiSiMe2-C6H4-CO2H.

Discussion now turns to EUV lithography applications that employ chemically amplified resists. Notably, when chemically amplified resists are patterned in a 1-D confined grating, registration offsets cause crescent-shaped openings and poor CDU in the unconfined direction.

Figure 16:
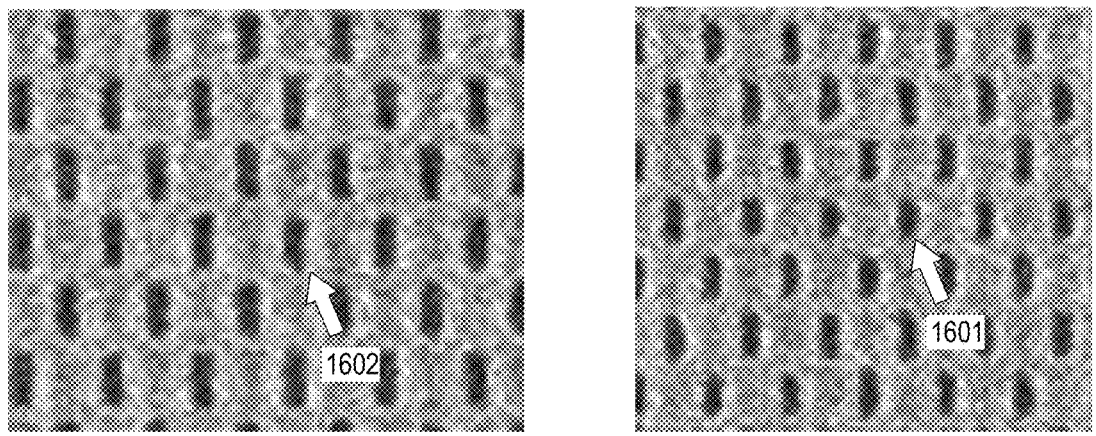
FIG. 16 illustrates exemplary chemically amplified resist SEMs illustrating crescent-shaped openings and poor CDU in an unconfined direction.

FIG. 16 illustrates exemplary chemically amplified resist SEMs illustrating crescent-shaped openings 1601 and poor CDU in the unconfined direction 1602 (e.g., y-direction), arranged in accordance with at least some implementations of the present disclosure. Techniques discussed herein improve CDU in the unconfined direction (e.g., y-direction) in chemically amplified resists through overlay window as well as providing other benefits.

Figure 17:
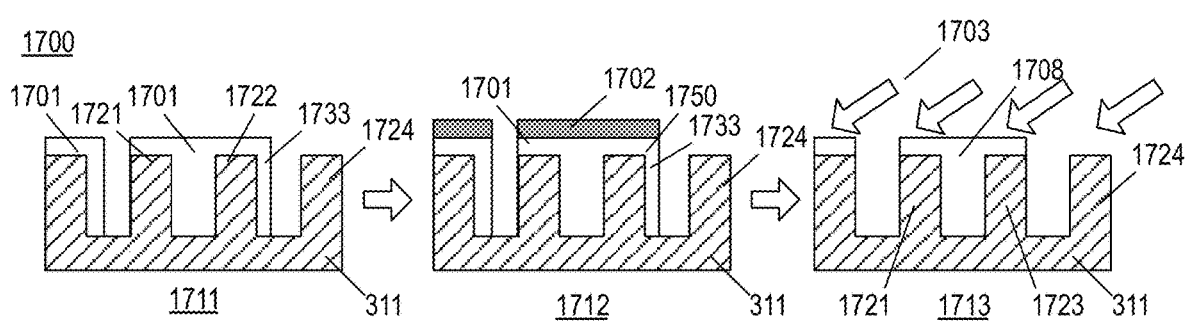
FIG. 17 illustrates an example EUV patterning process using an angled etch for improved overlay window in patterned resist.
Figure 17:
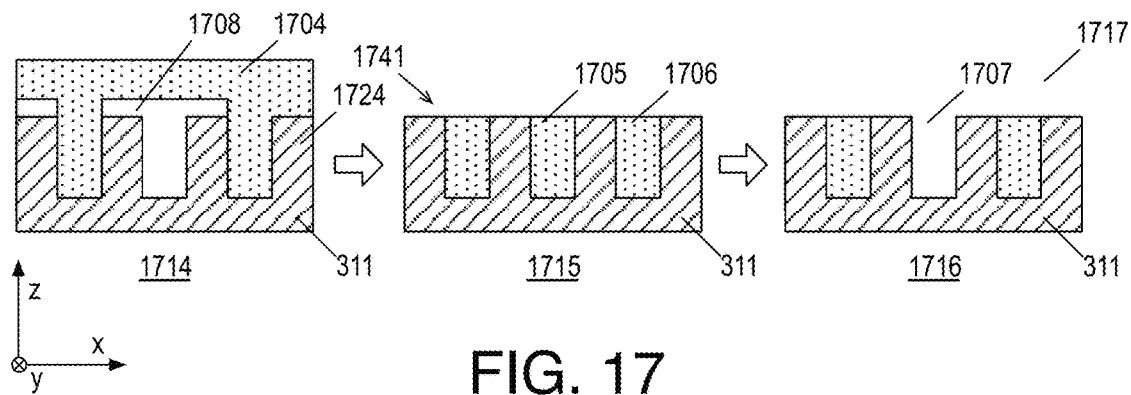

FIG. 17 illustrates an example EUV patterning process 1700 using an angled etch for improved overlay window in patterned resist, arranged in accordance with at least some implementations of the present disclosure. As shown in FIG. 17, process 1700 includes receiving grating 311, which may be any grating discussed herein, and patterning 1711 via EUV exposure a photoresist such as a chemically amplified resist to form a plug 1701 or similar structure between lines 1721, 1722 of grating 311. Also as shown, patterning 1711 of resist 1750, due to misalignment in the constrained direction (e.g., x-direction) provides for a misaligned portion 1733 of plug 1701 on a sidewall of line 1722 between line 1722 and line 1724. Misaligned portion 1733 may be a part of plug 1701 or it may be discrete from plug 1701. As shown, plug 1701 extends in the z-direction above a top surface of lines 1721, 1722, 1724 of grating 311.

Processing continues with deposition 1712 of a material layer 1702 on a top surface of patterned resist 1750 including top surfaces of plug 1701 and misaligned portion 1733. Material layer 1702 may be deposited using any suitable technique or techniques such as helmet deposition techniques (via CVD for example) and may include any suitable material or materials such as titanium nitride, zirconium oxide, silicon carbide, silicon nitride, or silicon oxide. As shown, after deposition 1712, an angled etch 1713 (as illustrated via arrows 1703) is performed using any suitable technique or techniques such as plasma etching techniques to remove material layer 1702 and misaligned portion 1733, leaving a refined plug 1708 having no resist material between lines 1723, 1724 such that refined plug 1708 is not within any trench other than the trench between lines 1721, 1723 (and, optionally, with some resist on top of lines 1721, 1723). In some embodiments, grating 311 has etch selectively with respect to both the material of plug 1701 and material layer 1702. In some embodiments, angled etch 1713 is a timed etch to remove a particular thickness of resist material. Angled etch 1713 may be performed at any suitable angle. In some embodiments, angled etch 1713 is performed at an angle of not more than 45 degrees with respect to a top surface of grating 311 (e.g., not more than 45 degrees with respect to the x-y plane).

After angled etch 1713, a material layer 1704 (e.g., a backfill material) is formed over grating 311 and refined plug 1708 at backfill operation 1714 such that a top surface of material layer 1704 extends above the top surfaces of lines of grating 311 and refined plug 1708. Material layer 1704 may be formed using any suitable deposition techniques and may include any suitable material or material including silicon oxide, aluminum oxide, or silicon carbide. Processing continues at polish operation 1715 where portions of material layer 1704 and refined plug 1708 are removed via planar or polish processing to provide a substantially planer surface 1741 and to expose grating 311 and to remove portions of material layer 1704 and refined plug 1708 such that remaining portions thereof are within trenches of grating 311. For example, final plug 1705 is in a trench between lines 1721, 1722 and material layer 1706 is also contained within trenches of grating 311.

At resist ash operation 1716, final plug 1705 is removed via ash processing (e.g., plasma ashing) to provide a final pattern 1717. Notably, final pattern 1717 includes an opening 1707 defined by plug 1701, refined plug 1708, and final plug 1705. Notably, final pattern 1717 includes a full opening (e.g., a round, oval, square, or rectangular opening) that is well defined and without crescent shape. For example, all sidewalls of opening 1707 may be linear or concave with respect to a center of opening 1707 (e.g., no sidewalls are convex and a crescent shape is not present). Subsequent to operation 1716, final pattern 1717 may be used to transfer a pattern to an underlying dielectric material for the eventual formation of vias between layers of metallization (e.g., metal lines), or any other patterning, as part of the formation of an integrated circuit. In some embodiments, vias may be formed in openings (e.g., opening 1707) and final pattern 1717 inclusive of grating 311 and material layer 1706 may be used as a dielectric for the via layer (which interconnects metallization layers) as part of a final integrated circuit.

Discussion now turns to EUV lithography applications that employ scissionable resists. Notably, positive-tone main-chain scissionable resists are employed in some contexts. Furthermore, common chain scission resists such as polymethyl methacrylate (PMMA) cross-link at very high exposure doses and thereby switch the tone of the resist. For example, in some resist systems, at low exposure doses the resist is positive tone but at very high exposure dose the resist is negative tone.

Incorporating halides into the alpha position of an acrylate homopolymer significantly lowers the dose for both chain scission (at lower exposure dose) as well as the subsequent cross-linking mechanism (at higher exposure dose). Independently (e.g., in addition or in the alternative), incorporating, for example, fluorinated groups onto an acrylate monomer also lowers the EUV exposure dose through the absorption of more photons. Synthesizing resists that include each of these features provides the cross-linking mechanism of these chain scission resists into a usable dose range in EUV production contexts. By having opposing solubility switching mechanisms at low dose vs. high dose, the overall contrast of the negative-tone resist is enhanced by requiring a threshold amount of photons to reach the high-dose pathway. Additionally, in an off-registration (e.g., 1D PB or 1D grating) scenario, the neighboring trench receives only a small amount of dose resulting mainly in scission vs. cross-linking chemistry. Thereby, the contrast of the EUV photoresist is improved via incorporation of halides into the alpha position of an acrylate homopolymer.

In some embodiments, an EUV photoresist composition includes a solvent and any number acrylate homopolymers, such that all or some of the acrylate homopolymers include halides in alpha positions of the monomer units of the homopolymers(s). Notably, incorporating halides into the alpha position of an acrylate homopolymer significantly lowers the dose for both chain scission as well as the subsequent cross-linking mechanism as discussed above. In some embodiments, an EUV photoresist composition includes a solvent and any number acrylate homopolymers, such that all or some of the acrylate homopolymers include fluorinated groups on the monomer units of the homopolymers(s). Incorporating fluorinated groups into the monomer units of an acrylate homopolymer, as discussed, significantly lowers the dose for both chain scission as well as the subsequent cross-linking mechanism as discussed above.

Figure 18:
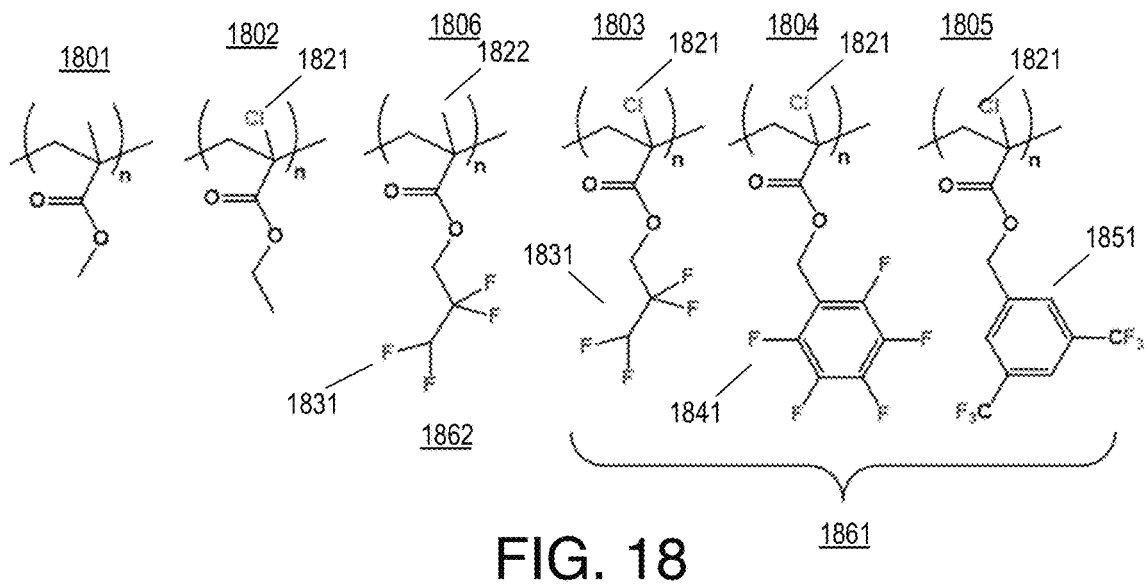
FIG. 18 illustrates example acrylate monomers including halides in the alpha position of an acrylate homopolymer and/or fluorinated groups on the monomer units of the homopolymers.

FIG. 18 illustrates example acrylate monomers including halides in the alpha position of an acrylate homopolymer and/or fluorinated groups on the monomer units of the homopolymers, arranged in accordance with at least some implementations of the present disclosure. FIG. 18 further illustrates PMMA 1801 for reference. In the context of FIG. 18, acrylate homopolymers (e.g., having n-monomers) include any number (and corresponding molecular weights) of the illustrated monomers. Such acrylate homopolymers are included in an EUV photoresist compositions, which also may include a solvent, other components, and/or additives as discussed herein.

In some embodiments, an acrylate monomer 1802 is included as a monomer of a homopolymer of a EUV photoresist composition. As shown, acrylate monomer 1802 includes a halide 1821 at an alpha position (e.g., bonded to an alpha carbon) of acrylate monomer 1802. For example, the alpha position of the acrylate monomer may indicate the first carbon that attaches to the acrylate monomer in the homopolymer. Although illustrated with respect to a chlorine atom, halide 1821 may include a chlorine atom, a fluorine atom, a bromine atom, or an iodine atom. For example, such halide atoms may be in an ionic form such that a chloride, fluoride, bromine, or iodide is provided in acrylate monomer 1802. Notably, acrylate monomer 1802 is absent any additional fluorinated group (as discussed with respect to acrylate monomers 1803, 1804, 1805). As discussed, inclusion of halide 1821 improves the dose of the corresponding EUV photoresist composition that includes the homopolymers that is a chain of any number of acrylate monomers 1802. Furthermore, acrylate monomer 1802 includes an additional carbon atom in the chain extending from the oxygen atom of the chain (with respect to PMMA 1801). In some embodiments, acrylate monomer 1802 may be characterized as an ethyl chloroacrylate monomer.

In some embodiments, an acrylate monomer 1803 is included as a monomer of a homopolymer of a EUV photoresist composition. As shown, acrylate monomer 1803 (characterized as one of synthetic targets 1861) includes halide 1821 at the alpha position thereof and a fluorinated group 1831. Although illustrated inclusive of halide 1821, in some embodiments, acrylate monomer 1803 may be absent halide 1821 (with a hydrogen atom in its place). Acrylate monomer 1803 includes, after the carbon atom extending along the chain of acrylate monomer 1803 from the oxygen atom of the chain, a fluorinated group 1831. The term fluorinated group indicates a group of a monomer having one or more fluorine atoms. For example, the fluorine atom(s) may replace hydrogen atoms in the group to provide the fluorinated group. As shown, fluorinated group 1831 includes two carbon atoms each having two fluorine atoms bonded thereto. A first of the carbon atoms of fluorinated group 1831 is bonded to the previously discussed carbon atom after the oxygen atom in the chain. The second of the carbon atoms of fluorinated group 1831 is covalently bonded to the first of the carbon atoms of the fluorinated group 1831. In some embodiments, fluorinated group 1831 may be characterized as a tetrafluoroethyl group. Inclusion of fluorinated group 1831 (and optional halide) improves the dose of the corresponding EUV photoresist composition that includes the homopolymers that is a chain of any number of acrylate monomers 1803.

In some embodiments, an acrylate monomer 1806 is included as a monomer of a homopolymer of a EUV photoresist composition. As shown, acrylate monomer 1806 (which may be characterized as an F4 homopolymer 1862) includes a methyl group 1822 at the alpha position thereof and fluorinated group 1831. Acrylate monomer 1803 includes, after the carbon atom extending along the chain of acrylate monomer 1806 from the oxygen atom of the chain, fluorinated group 1831. As discussed, fluorinated group 1831 includes two carbon atoms each having two fluorine atoms bonded thereto. A first of the carbon atoms of fluorinated group 1831 is bonded to the previously discussed carbon atom after the oxygen atom in the chain. The second of the carbon atoms of fluorinated group 1831 is covalently bonded to the first of the carbon atoms of the fluorinated group 1831. In some embodiments, fluorinated group 1831 may be characterized as a tetrafluoroethyl group. Inclusion of fluorinated group 1831 (and optional halide) improves the dose of the corresponding EUV photoresist composition that includes the homopolymers that is a chain of any number of acrylate monomers 1803.

In some embodiments, an acrylate monomer 1804 is included as a monomer of a homopolymer of a EUV photoresist composition. As shown, acrylate monomer 1804 (characterized as one of synthetic targets 1861) includes halide 1821 at the alpha position thereof and a fluorinated group 1841. Although illustrated inclusive of halide 1821, in some embodiments, acrylate monomer 1804 may be absent halide 1821. Acrylate monomer 1804 includes, after the carbon atom extending along the chain of acrylate monomer 1804 from the oxygen atom of the chain, a fluorinated group 1841. As shown, fluorinated group 1841 includes a benzene ring having five fluorine atoms bonded thereto (e.g., at all positions of the benzene ring not bonded the carbon atom in the chain of acrylate monomer 1804). Although illustrated with respect to five fluorine atoms bonded to the benzene ring of fluorinated group 1841, the benzene ring may have any number of fluorine atoms (e.g., one, two, three, or four) bonded thereto at any positions of the benzene ring. As shown, the benzene ring of fluorinated group 1841 is bonded to the previously discussed carbon atom after the oxygen atom in the chain. The fluorine atoms of fluorinated group 1841 are in turn bonded to the benzene ring. In some embodiments, fluorinated group 1841 may be characterized as a fluorobenzene group. Inclusion of fluorinated group 1841 (and optional halide) improves the dose of the corresponding EUV photoresist composition that includes the homopolymers that is a chain of any number of acrylate monomers 1804.

In some embodiments, an acrylate monomer 1805 is included as a monomer of a homopolymer of a EUV photoresist composition. As shown, acrylate monomer 1805 (characterized as one of synthetic targets 1861) includes halide 1821 at the alpha position thereof and a fluorinated group 1851. Although illustrated inclusive of halide 1821, in some embodiments, acrylate monomer 1805 may be absent halide 1821. Acrylate monomer 1805 includes, after the carbon atom extending along the chain of acrylate monomer 1804 from the oxygen atom of the chain, a fluorinated group 1851. As shown, fluorinated group 1851 includes a benzene ring having two trifluoromethyl groups (e.g., each trifluoromethyl group including a carbon atom and three fluorine atoms) bonded thereto (e.g., at 3, 5 positions of the benzene ring relative to a 1 position of the carbon bond to the oxygen in the chain of acrylate monomer 1805). Although illustrated with respect to two trifluoromethyl groups bonded to the benzene ring of fluorinated group 1851, the benzene ring may have any number of trifluoromethyl groups (e.g., one, three, four, or five) bonded thereto at any positions of the benzene ring. As shown, the benzene ring of fluorinated group 1851 is bonded to the previously discussed carbon atom after the oxygen atom in the chain. The trifluoromethyl groups of fluorinated group 1851 are in turn bonded to the benzene ring. In some embodiments, fluorinated group 1851 may be characterized as a tris(trifluoromethyl)benzene group. Inclusion of fluorinated group 1851 (and optional halide) improves the dose of the corresponding EUV photoresist composition that includes the homopolymers that is a chain of any number of acrylate monomers 1805.

Figure 19:
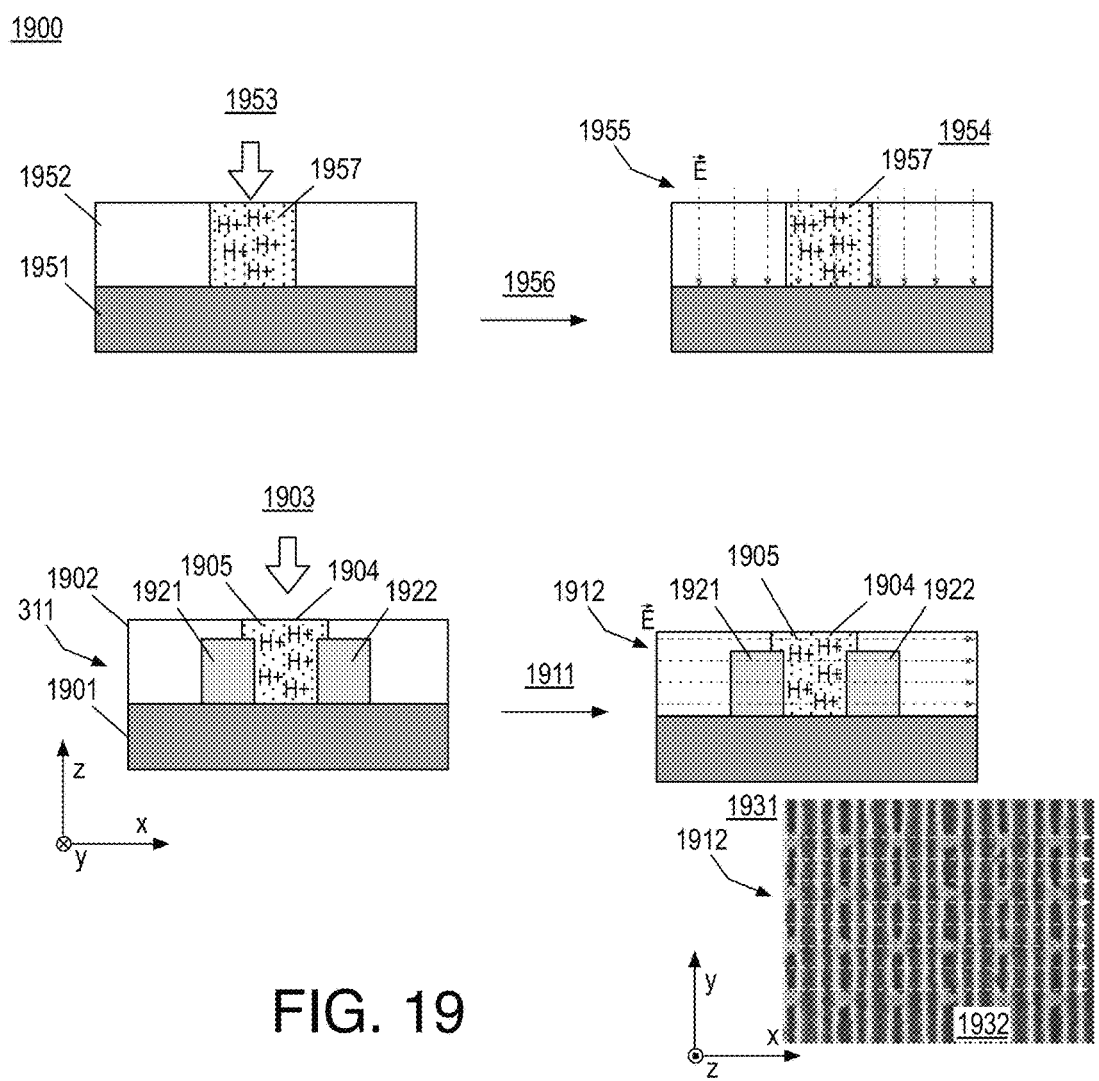
FIG. 19 illustrates an example EUV patterning process using an applied electric field during post exposure bake for improved resist patterning.

Discussion now turns to electric field enhanced post exposure processing for improved EUV photolithography patterning. In some embodiments, CDU in the unconfined direction is improved by applying an electric field during the post-exposure bake of the EUV patterning process. Such electric field application during post-exposure bake enhances drift of the photo-generated acid and/or any ionized species in the direction of the field, while limiting acid or ionic species diffusion in any unconfined direction. Such techniques can be used in conjunction with others discussed herein such as angled etch processing or others, to simultaneously improve unconfined CDU and maintain a high overlay window in the confined direction. Similarly, an in-plane electric field can be employed to enhance acid or ionic species drift in the confined direction, while limiting diffusion in the unconfined direction FIG. 19 illustrates an example EUV patterning process 1900 using an applied electric field during post exposure bake for improved resist patterning, arranged in accordance with at least some implementations of the present disclosure. The top portion of FIG. 19 illustrates, after EUV exposure 1953 of a resist layer 1952 on or over a substrate 1951, an electric field application 1955 during a post-exposure bake 1954 (i.e., a combined electric field application and post exposure bake 1956) enhances drift of a photo-generated acid 1957 (illustrated as H+) and/or any ionized species in the direction of the field of electric field application 1955 (e.g., in a vertical or z-direction in the top portion of FIG. 19.

Also as shown in FIG. 19 (in a bottom portion of FIG. 19), a substrate 1901 having grating 311 on or over substrate 1901 is received or fabricated. An EUV resist layer 1902 is formed over grating 311 and substrate 1901 using spin on techniques or the like. As shown, in some embodiments, a top surface of EUV resist layer 1902 is above top surfaces of lines 1921, 1922 of grating 311. EUV resist layer 1902 may include any resist material system discussed herein that releases an acid and/or ion species in response to an EUV exposure 1903. In some embodiments, EUV resist layer 1902 is a chemically amplified resist.

During EUV exposure 1903, a portion 1904 of EUV resist layer 1902 is exposed with EUV radiation to define a plug or other feature shape between lines 1921, 1922 of grating 311. Furthermore, EUV exposure 1903 releases acid species 1905 (illustrated as H+) and/or ion species in the exposed portion 1904. After EUV exposure 1903, an electric field 1912 is applied during the post exposure bake (electric field post exposure bake 1911) such that the electric field is in-plane with respect to substrate 1901 (e.g., along a plane of substrate 1901 in the x-y plane). Furthermore, the in-plane electric field is applied orthogonal to lines 1921, 1922 of grating 311 (e.g., in the x-direction in the x-y plane). As shown with respect to insert image 1931, electric field 1912 in such a direction aids in resolving an otherwise triangular plug shape 1932. That is, electric field 1912 provides drift of acid and/or ion species toward lines 1921, 1922 to promote fully formed plugs that may otherwise have an undesirable triangular shape.

In other contexts, application of electric field during post exposure bake provides for self-aligned patternable hardmasks. In some embodiments, the following techniques provide for self-alignment of a top-down lithography patterned hardmask on top of a metal/ILD pattern. Notably, current EUV direct patterning is limited by overlay errors on the EUV scanner. The following techniques employ an electric field-enhanced post exposure bake to drive acid species and/or photoactive ionic species in the patternable hardmask over positively-charged metal patterns, improving alignment over underlying patterns. In some embodiments, an electric-field enhanced post exposure bake process is used to improve EUV lithography patterning to an underlying metal feature.

Figure 20:
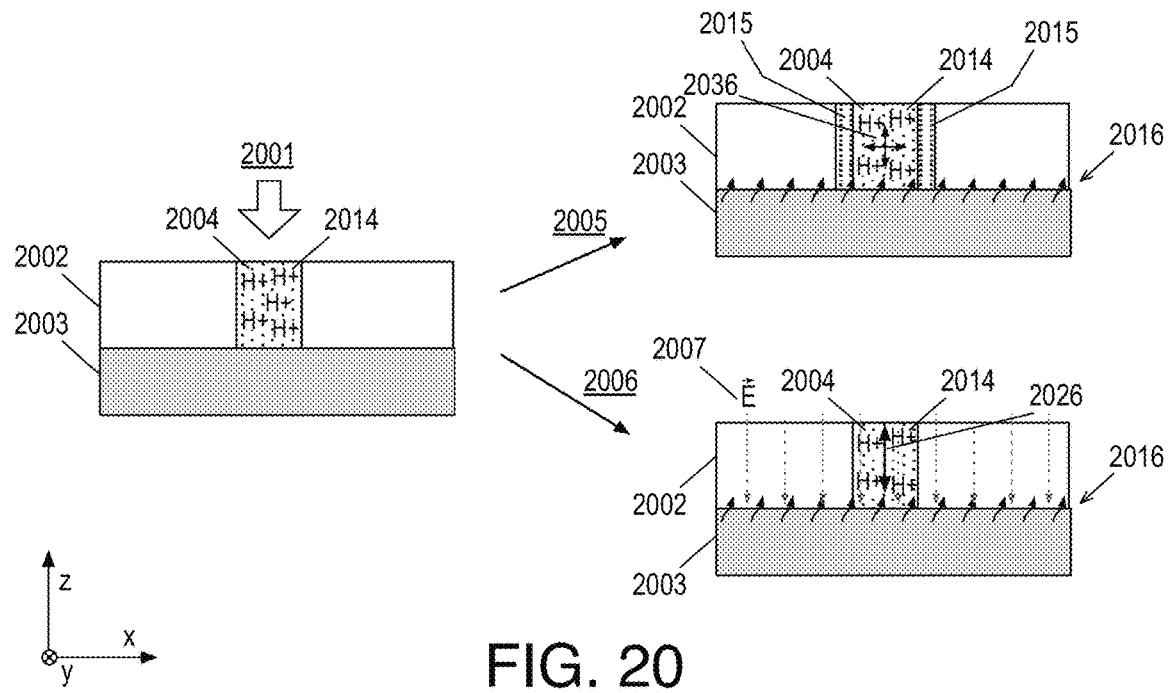
FIG. 20 illustrates example EUV patterning enhanced using an applied electric field during post exposure bake.

FIG. 20 illustrates example EUV patterning enhanced using an applied electric field during post exposure bake, arranged in accordance with at least some implementations of the present disclosure. As shown in FIG. 20, in some context, during an EUV exposure 2001 of photoactive materials (e.g., an EUV resist 2002 formed on a substrate 2003), acid species 2004 are generated in exposed regions 2014. During a typical hotplate PEB 2005, acid species 2004 will blur 2036 in x, y, and z directions (caused at least in part by applied heat 2016) and deprotect the resist backbone, rendering the material soluble in the developer in resist blur regions 2015 adjacent exposed region 2014.

Using an electric-field enhanced post exposure bake process 2006, an electric field 2007 is applied in the vertical direction (e.g., the z-direction) with applied heat 2016, to enhance the drift of the acid (i.e., acid species 2004) and/or ionic species in vertical direction 2026, and to limit the drift in the x- and y-directions (e.g., the in-plane direction). As shown, on neutral substrate 2003, the drift is enhanced in the direction of the applied field (e.g., vertically in the illustrated example).

In some embodiments, the same patterning process discussed with respect to FIG. 20 inclusive of electric-field enhanced post exposure bake process 2006 is performed on a patterned substrate.

Figure 21:
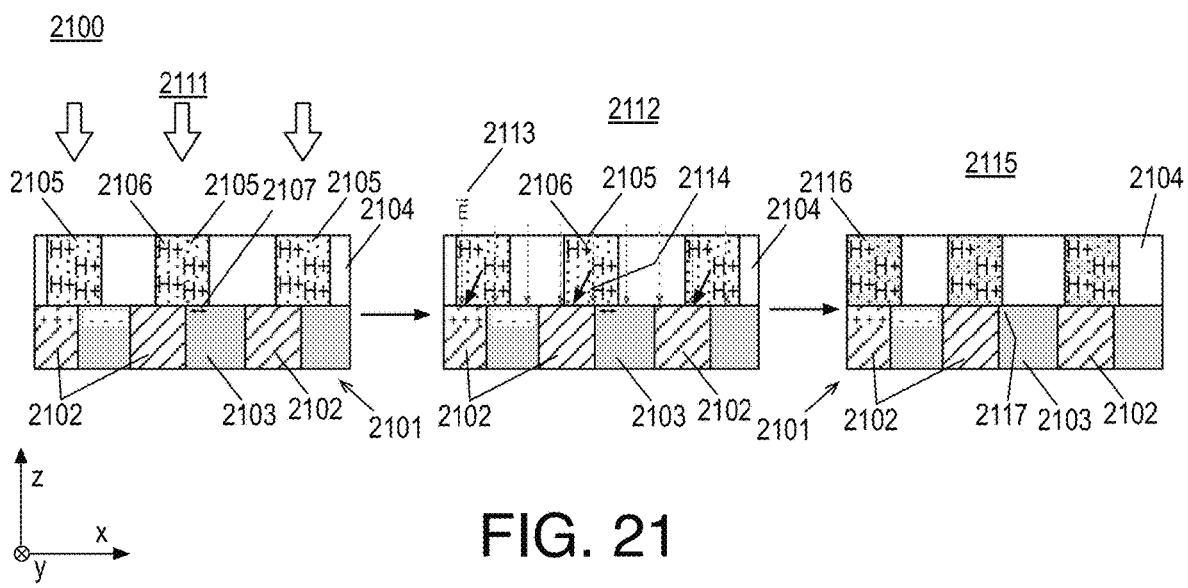
FIG. 21 illustrates example EUV patterning process enhanced using an applied electric field during post exposure bake on a patterned substrate including exposed metal features in a dielectric layer.

FIG. 21 illustrates example EUV patterning process 2100 enhanced using an applied electric field during post exposure bake on a patterned substrate including exposed metal features in a dielectric layer, arranged in accordance with at least some implementations of the present disclosure. As shown in FIG. 21, a substrate 2101 is received such that substrate 2101 includes exposed metal features 2102 that are adjacent to a dielectric layer 2103. For example, metal features 2102 may be embedded or patterned within dielectric layer 2103 such that metal features 2102 and dielectric layer 2103 provide a substantially planar top surface (e.g., in the x-y plane). For example, metal features 2102 may be metal lines of a metal interconnect layer and metal features 2102 and dielectric layer 2103 may be characterized as a metallization or interconnect layer. As shown, an EUV resist layer 2104 including any resist material system discussed herein that releases an acid and/or ion species in response to an EUV exposure 2111. In some embodiments, EUV resist layer 2104 is a chemically amplified resist. In some embodiments, EUV resist layer 2104 is an inorganic cluster resist. In some embodiments, EUV resist layer 2104 is a metal oxide cluster resist. In some embodiments, EUV resist layer 2104 includes a patternable metal such as tin, hafnium, zirconium, titanium, aluminum, or tungsten. Such materials may be implemented in any suitable resist material systems discussed herein.

During EUV exposure 2111, portions of EUV resist layer 2104 are exposed with EUV radiation to define exposed resist regions 2105. Notably, it is desirable that exposed resist regions 2105 (and eventual openings corresponding to exposed resist regions 2105) align with corresponding metal features 2102. For example, the eventual openings corresponding to exposed resist regions 2105 may provide vias that ideally land squarely and aligned with metal features 2102 (e.g., in both the x- and y-directions with the x-direction being critical in the example of FIG. 21 assuming metal features 2102 are lines running in the y-direction). However, due to EUV tool limitations, lack of surface wafer flatness, or other reasons, exposed resist regions 2105 may have several nm of overlay error 2107 with respect to one of metal features 2102.

Furthermore, EUV exposure 2111 releases acid species 2106 (illustrated as H+) and/or ion species in exposed resist regions 2105. After EUV exposure 2111, an electric field 2113 is applied during the post exposure bake (electric field PEB 2112) such that electric field 2113 is out of plane or orthogonal to the plane with respect to substrate 2101 (e.g., in the z-direction). When electric field 2113 is applied during the post exposure bake (electric field PEB 2112), the charged acid species and/or ion species of exposed resist regions 2105 drift towards the metal features 2102, as shown with respect to charged acid species and/or ion species movement 2114, improving the overlay of the pattern as shown with respect to improved overlay pattern 2115. In some embodiments, when electric field 2113 is applied during the post exposure bake (electric field PEB 2112), the positively charged acid species and/or ion species drift towards the positively charged metal, improving the overlay of the pattern. For example, as shown, resist regions 2116, which will be removed in subsequent processing, of improved overlay pattern 2115 are better aligned with respect to corresponding metal features 2102. For example, as shown with respect to overlay error 2117, the overlay error of improved overlay pattern 2115 may be substantially less than that with respect to overlay error 2107.

In some embodiments, to prevent the acids from deprotecting the polymer in unwanted regions before self-alignment of the acids, a pre-PEB (pre post exposure bake) is applied at a temperature high enough to mobilize the acid, but not high enough energy to deprotect the polymer. In some embodiments, the pre-PEB is performed at a temperature in the range of 60° C. to 80° C. and electric field PEB 2112 is performed at a temperature in the range of 90° C. to 120° C. In some embodiments, the pre-PEB is performed at a temperature in the range of one of 60° C. to 70° C., 65° C. to 75° C., or 70° C. to 80° C. and electric field PEB 2112 is performed at a temperature in the range of one of 90° C. to 105° C., 100° C. to 110° C., or 105° C. to 120° C. For example, such temperatures may be a maximum applied temperature during the bake. In some embodiments, an electric field is also applied (in the same direction) during the pre-PEB. In some embodiments, an electric field is applied during both the pre-PEB and the PEB. In some embodiments, an electric field is applied during the pre-PEB but not the PEB. In some embodiments, an electric field is applied during the PEB but not the pre-PEB.

As shown, in some embodiments, EUV resist layer 2104 is formed on a top surface of substrate 2101 including metal features 2102 and dielectric layer 2103. In some embodiments, EUV resist layer 2104 is formed on a BARC (bottom anti-reflective coating). In some embodiments, the EUV resist layer is formed on a BARC layer, which is on metal features 2102 and dielectric layer 2103.

Figure 22:
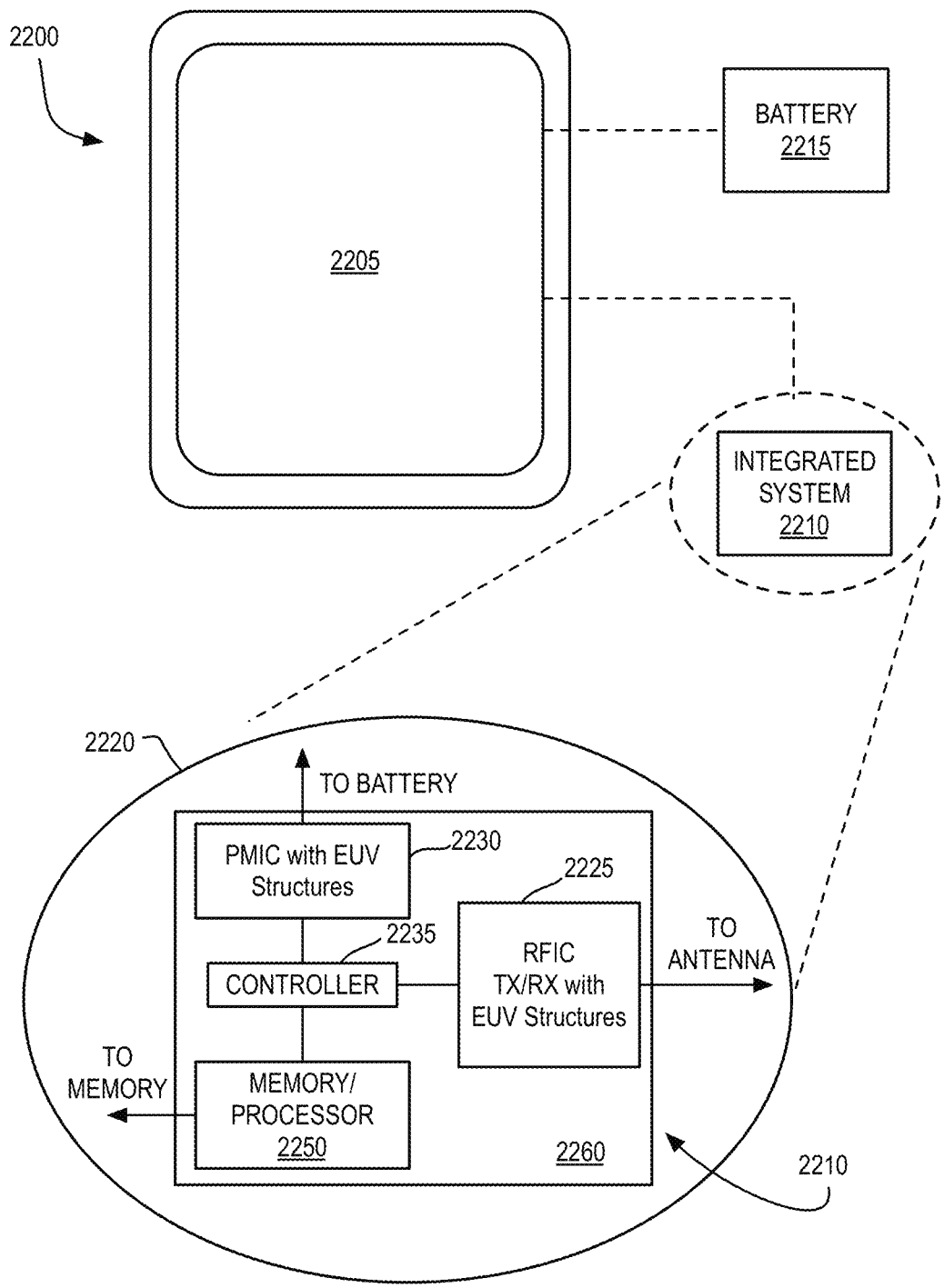
FIG. 22 is an illustrative diagram of a mobile computing platform employing an EUV structure.

FIG. 22 is an illustrative diagram of a mobile computing platform 2200 employing an IC with transistor(s) and/or diode(s) having EUV structures, arranged in accordance with at least some implementations of the present disclosure. The term EUV structure with respect to FIG. 22 may include any structure discussed herein formed using EUV techniques such as final device structures having any structure, material, or device characteristics discussed herein. Mobile computing platform 2200 may be any portable device configured for each of electronic data display, electronic data processing, wireless electronic data transmission, or the like. For example, mobile computing platform 2200 may be any of a tablet, a smart phone, a netbook, a laptop computer, etc. and may include a display screen 2205, which in the exemplary embodiment is a touchscreen (e.g., capacitive, inductive, resistive, etc. touchscreen), a chip-level (SoC) or package-level integrated system 2210, and a battery 2215. Battery 2215 may include any suitable device for providing electrical power such as a device consisting of one or more electrochemical cells and electrodes to couple to an outside device.

Integrated system 2210 is further illustrated in the expanded view 2220. In the exemplary embodiment, packaged device 2250 (labeled "Memory/Processor" in FIG. 22) includes at least one memory chip (e.g., RAM), and/or at least one processor chip (e.g., a microprocessor, a multi-core microprocessor, or graphics processor, or the like). In an embodiment, the package device 2250 is a microprocessor including an SRAM cache memory. Packaged device 2250 may be further coupled to (e.g., communicatively coupled to) a board, a substrate, or an interposer 2260 along with, one or more of a power management integrated circuit (PMIC) 2230, RF (wireless) integrated circuit (RFIC) 2225 including a wideband RF (wireless) transmitter and/or receiver (TX/RX) (e.g., including a digital baseband and an analog front end module further comprises a power amplifier on a transmit path and a low noise amplifier on a receive path), and a controller thereof 2235. In general, packaged device 2250 may be also be coupled to (e.g., communicatively coupled to) display screen 2205. As shown, one or both of PMIC 2230 and RFIC 2225 may employ transistor(s) and/or diode(s) having EUV structure(s).

Functionally, PMIC 2230 may perform battery power regulation, DC-to-DC conversion, etc., and so has an input coupled to battery 2215 and with an output providing a current supply to other functional modules. In an embodiment, PMIC 2230 may perform high voltage operations. As further illustrated, in the exemplary embodiment, RFIC 2225 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of packaged device 2250 or within a single IC (SoC) coupled to the package substrate of the packaged device 2250.

Figure 23:
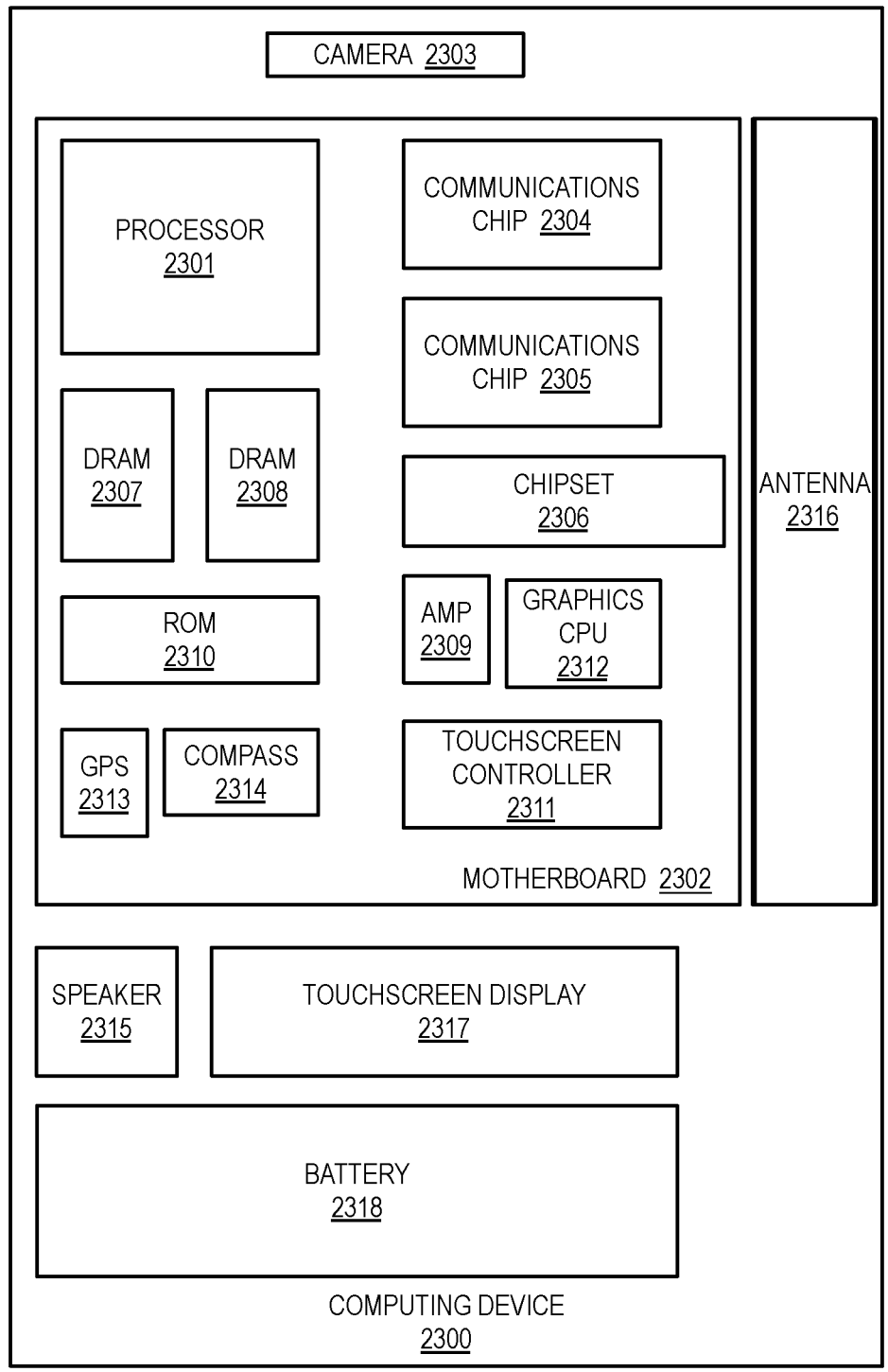
FIG. 23 is a functional block diagram of a computing device, all arranged in accordance with at least some implementations of the present disclosure.

FIG. 23 is a functional block diagram of a computing device 2300, arranged in accordance with at least some implementations of the present disclosure. Computing device 2300 may be found inside platform 2200, for example, and further includes a motherboard 2302 hosting a number of components, such as but not limited to a processor 2301 (e.g., an applications processor) and one or more communications chips 2304, 2305. Processor 2301 may be physically and/or electrically coupled to motherboard 2302. In some examples, processor 2301 includes an integrated circuit die packaged within the processor 2301. In general, the term "processor" may refer to any device or portion of a device that processes electronic data from registers and/or memory to transform that electronic data into other electronic data that may be stored in registers and/or memory. Any one or more device or component of computing device 2300 may include transistor(s) or transistor structure(s) and/or diode(s) and/or diode structure(s) having EUV structure(s) as discussed herein.

In various examples, one or more communication chips 2304, 2305 may also be physically and/or electrically coupled to the motherboard 2302. In further implementations, communication chips 2304 may be part of processor 2301. Depending on its applications, computing device 2300 may include other components that may or may not be physically and electrically coupled to motherboard 2302. These other components may include, but are not limited to, volatile memory (e.g., DRAM) 2307, 2308, non-volatile memory (e.g., ROM) 2310, a graphics processor 2312, flash memory, global positioning system (GPS) device 2313, compass 2314, a chipset 2306, an antenna 2316, a power amplifier 2309, a touchscreen controller 2311, a touchscreen display 2317, a speaker 2315, a camera 2303, and a battery 2318, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like.

Communication chips 2304, 2305 may enables wireless communications for the transfer of data to and from the computing device 2300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 2304, 2305 may implement any of a number of wireless standards or protocols, including but not limited to those described elsewhere herein. As discussed, computing device 2300 may include a plurality of communication chips 2304, 2305. For example, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

As used in any implementation described herein, the term "module" refers to any combination of software, firmware and/or hardware configured to provide the functionality described herein. The software may be embodied as a software package, code and/or instruction set or instructions, and "hardware", as used in any implementation described herein, may include, for example, singly or in any combination, hardwired circuitry, programmable circuitry, state machine circuitry, and/or firmware that stores instructions executed by programmable circuitry. The modules may, collectively or individually, be embodied as circuitry that forms part of a larger system, for example, an integrated circuit (IC), system on-chip (SoC), and so forth.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

In one or more first embodiments, an integrated circuit comprises a grating comprising a plurality of parallel lines, a plug extending between a first sidewall of a first line of the grating and a second sidewall of a second line of the grating, the plug comprising a bulk metal oxide cluster resist material and a molecule grafted to the first sidewall, the molecule comprising one of a cross-linking moiety, a capping agent, an electron quencher, or a Lewis base generator, and a metal line extending between the first sidewall, the second sidewall, and a third sidewall of the plug.

In one or more second embodiments, further to the first embodiments, the molecule is covalently bonded to the first sidewall at a first end of the molecule and a second end of the molecule comprises the cross-linking moiety, capping agent, or electron quencher.

In one or more third embodiments, further to the first or second embodiments, the molecule comprises the cross-linking moiety, the plug further comprises cross-linking moieties released from a plurality of second molecules grafted to the first sidewall, the released cross-linking moieties comprising one of water, carboxylic acid, sulfonic acid, phosphonic acid, an alcohol, an amine, a diamine, or a diphosphine.

In one or more fourth embodiments, further to any of the first through third embodiments, the molecule comprises the capping agent, the molecule comprising one of a nitrobenzyl group or a hydroxyphenacyl group.

In one or more fifth embodiments, further to any of the first through fourth embodiments, the molecule comprises the capping agent, the molecule comprising a photosensitive protecting group and a capping group.

In one or more sixth embodiments, further to any of the first through fifth embodiments, the photosensitive protecting group comprises one of a nitrobenzyl group or a hydroxyphenacyl group.

In one or more seventh embodiments, further to any of the first through sixth embodiments, the capping group comprises one of an alkoxide, a thiolate, a phenolate, a carboxylate, a carbonate, or a carbamate.

In one or more eighth embodiments, further to any of the first through seventh embodiments, the molecule comprises the electron quencher, the plug further comprises a radical, ionic species, or basic species.

In one or more ninth embodiments, further to any of the first through eighth embodiments, the molecule comprises the electron quencher, the plug further comprising one of sulfonium, an onium salt, an electron-deficient arene, a nitroarene, an alkene substituted with an electron withdrawing group, or an inorganic element in a higher oxidation state.

In one or more tenth embodiments, an integrated circuit comprises a grating comprising a plurality of parallel lines, a plug extending between a first sidewall of a first line of the grating and a second sidewall of a second line of the grating, the plug comprising a bulk inorganic cluster resist material and an additive comprising one of an electron quencher, a cross linking moiety, a radical scavenger, or a photoradical generator, and a metal line extending between the first sidewall, the second sidewall, and a third sidewall of the plug In one or more eleventh embodiments, further to the tenth embodiments, the additive comprises the electron quencher and the plug further comprises a molecule comprising a trapped metal oxide cation and a trapped radical group.

In one or more twelfth embodiments, further to the tenth or eleventh embodiments, the molecule comprises the metal oxide cation covalently bonded to a first oxygen atom, a radical group covalently bonded to a second oxygen atom, and a benzene ring bonded to the first oxygen atom at a first position of the benzene ring and bonded to the second oxygen atom at a second position of the benzene ring opposite the first position.

In one or more thirteenth embodiments, further to any of the tenth through twelfth embodiments, the bulk inorganic cluster resist material comprises a metal oxide cluster resist material.

In one or more fourteenth embodiments, further to any of the tenth through thirteenth embodiments, the additive comprises the cross linking moiety, the cross linking moiety comprising one of polyvinylalcohol, polyvinylpyridine, polyacrylic acid, polyhydroxystyrene, alcohol, pyridine, or carboxylic acid.

In one or more fifteenth embodiments, further to any of the tenth through fourteenth embodiments, the additive comprises the radical scavenger, the radical scavenger comprising one of diphenyl oxalate, tetramethylpyrrolidine-N-oxide (TEMPO), a derivate of tetramethylpyrrolidine-N-oxide, 1,1-diphenylethene, a 1,1-diphenylethene related alkene trap, substituted 1,4-cyclohexadiene, an H-atom donating organic species, tris-trimethylsilylsilane (Me3Si)3SiH, an H-atom donating main group complex, butylated hydroxytoluene (BHT), or a phenolic compound related to butylated hydroxytoluene.

In one or more sixteenth embodiments, further to any of the tenth through fifteenth embodiments, the bulk inorganic cluster resist material comprises hafnium oxide-methyl acrylate.

In one or more seventeenth embodiments, further to any of the tenth through sixteenth embodiments, the additive comprises the photoradical generator, the photoradical generator comprising one of a sulfonium salt, a disilane, or a bis-stannane.

In one or more eighteenth embodiments, further to any of the tenth through seventeenth embodiments, the bulk inorganic cluster resist material comprises hafnium carboxylate clusters.

In one or more nineteenth embodiments, a method comprises forming a grating comprising a plurality of parallel lines over a substrate, disposing a surface treatment material on the grating, the surface treatment material comprising one of a cross-linking moiety, a capping agent, an electron quencher, or a Lewis base generator, disposing a metal oxide cluster resist layer over the surface treatment material, exposing the metal oxide cluster resist layer with an EUV pattern to release a functional group corresponding to the cross-linking moiety, the capping agent, or the electron quencher, and developing the exposed metal oxide cluster resist layer to pattern a plug within the grating.

In one or more twentieth embodiments, further to the nineteenth embodiments, the surface treatment material comprises the electron quencher and exposing the metal oxide cluster resist layer comprises exposing a hammerhead shaped exposure feature to define the plug.

In one or more twenty-first embodiments, further to the nineteenth or twentieth embodiments, the surface treatment material comprises the cross-linking moiety, the plug further comprises cross-linking moieties released from a plurality of second molecules grafted to the first sidewall, the released cross-linking moieties comprising one of water, carboxylic acid, sulfonic acid, phosphonic acid, an alcohol, an amine, a diamine, or a diphosphine.

In one or more twenty-second embodiments, further to any of the nineteenth through twenty-first embodiments, the surface treatment material comprises the capping agent, the capping agent comprising one of a nitrobenzyl group or a hydroxyphenacyl group.

In one or more twenty-third embodiments, further to any of the nineteenth through twenty-second embodiments, the surface treatment material comprises the capping agent, the capping agent comprising a photosensitive protecting group and a capping group.

In one or more twenty-fourth embodiments, further to any of the nineteenth through twenty-third embodiments, the photosensitive protecting group comprises one of a nitrobenzyl group or a hydroxyphenacyl group.

In one or more twenty-fifth embodiments, further to any of the nineteenth through twenty-fourth embodiments, the capping group comprises one of an alkoxide, a thiolate, a phenolate, a carboxylate, a carbonate, or a carbamate.

In one or more twenty-sixth embodiments, further to any of the nineteenth through twenty-fifth embodiments, the surface treatment material comprises the electron quencher, the plug further comprises a radical, ionic species, or basic species.

In one or more twenty-seventh embodiments, further to any of the nineteenth through twenty-sixth embodiments, the surface treatment material comprises the electron quencher, the plug further comprising one of sulfonium, an onium salt, an electron-deficient arene, a nitroarene, an alkene substituted with an electron withdrawing group, or an inorganic element in a higher oxidation state.

In one or more twenty-eighth embodiments, an EUV photoresist composition comprises a plurality of inorganic clusters and an additive comprising one of an electron quencher, a cross linking moiety, a radical scavenging molecule, or a photoradical generator.

In one or more twenty-ninth embodiments, further to the twenty-eighth embodiments, the additive comprises the cross linking moiety, the cross linking moiety comprising one of polyvinylalcohol, polyvinylpyridine, polyacrylic acid, polyhydroxystyrene, or pyridine.

In one or more thirtieth embodiments, further to the twenty-eighth or twenty-ninth embodiments, the additive comprises the cross linking moiety, the cross linking moiety comprising a molecule having an alcohol group or a carboxylic acid group.

In one or more thirty-first embodiments, further to any of the twenty-eighth through thirtieth embodiments, the inorganic clusters comprise metal oxide clusters.

In one or more thirty-second embodiments, further to any of the twenty-eighth through thirty-first embodiments, the inorganic clusters comprise tin clusters.

In one or more thirty-third embodiments, further to any of the twenty-eighth through thirty-second embodiments, the additive comprises the radical scavenging molecule, the radical scavenging molecule comprising one of diphenyl oxalate, tetramethylpyrrolidine-N-oxide (TEMPO), a derivate of tetramethylpyrrolidine-N-oxide, 1,1-diphenylethene, a 1,1-diphenylethene related alkene trap, substituted 1,4-cyclohexadiene, an H-atom donating organic species, tris-trimethylsilylsilane (Me3Si)3SiH, an H-atom donating main group complex, butylated hydroxytoluene (BHT), or a phenolic compound related to butylated hydroxytoluene.

In one or more thirty-fourth embodiments, further to any of the twenty-eighth through thirty-third embodiments, the inorganic clusters comprise hafnium oxide-methyl acrylate.

In one or more thirty-fifth embodiments, further to any of the twenty-eighth through thirty-fourth embodiments, the additive comprises the photoradical generator, the photoradical generator comprising one of a sulfonium salt, a disilane, or a bis-stannane.

In one or more thirty-sixth embodiments, further to any of the twenty-eighth through thirty-fifth embodiments, the inorganic clusters comprise hafnium carboxylate clusters.

In one or more thirty-seventh embodiments, an EUV photoresist composition comprises a solvent and a plurality of inorganic clusters dispersed in the solvent, a first inorganic cluster of the inorganic clusters comprising a plurality of ligands, the plurality of ligands including at least one of alkylcarboxylic acid, arylcarboxylic acid, pivalic acid, isobutyric acid, benzoic acid, or pentafluorobenzoic acid.

In one or more thirty-eighth embodiments, an EUV photoresist composition comprises a solvent and a plurality of inorganic clusters dispersed in the solvent, a first inorganic cluster of the inorganic clusters comprising a radical trapping ligand incorporated into an arylcarboxylic acid as a substituent on a benzene ring of the first inorganic cluster.

In one or more thirty-ninth embodiments, further to the thirty-eighth embodiments, the radical trapping ligand comprises 4-Me3SiSiMe2-C6H4-CO2H.

In one or more fortieth embodiments, an integrated circuit comprises a grating comprising a plurality of parallel lines, a plug between a first sidewall of a first line of the grating and a second sidewall of a second line of the grating, the plug comprising a bulk resist material, a coating on the plug but absent at least a top surface of the first and second lines, the coating extending from the plug to at least the first sidewall, and a metal line extending between the first sidewall, the second sidewall, and a portion of the coating on a third sidewall of the plug.

In one or more forty-first embodiments, further to the fortieth embodiments, the coating comprises titanium nitride.

In one or more forty-second embodiments, further to the fortieth or forty-first embodiments, the plug is in contact with the second sidewall.

In one or more forty-third embodiments, further to any of the fortieth through forty-second embodiments, the coating extends from the plug to contact the second sidewall.

In one or more forty-fourth embodiments, further to any of the fortieth through forty-third embodiments, the coating comprises $OSi(CH_3)_3$ and titanium nitride, the bulk resist material comprises tin, and the grating comprises silicon oxide.

In one or more forty-fifth embodiments, an integrated circuit comprises a grating comprising a plurality of parallel lines, a plug between a first sidewall of a first line of the grating and a second sidewall of a second line of the grating, the plug comprising a bulk resist material, a coating on the first and second lines and absent at least a top surface of the plug, the coating extending from at least the first sidewall to the plug, and a metal line extending between coating on the first and second sidewalls, and a third sidewall of the plug.

In one or more forty-sixth embodiments, further to the forty-fifth embodiments, the coating comprises titanium nitride.

In one or more forty-seventh embodiments, further to the forty-fifth or forty-sixth embodiments, the coating extends from the second sidewall to the plug.

In one or more forty-eighth embodiments, further to any of the forty-fifth through forty-seventh embodiments, the coating comprises $OSi(CH_3)_3$ and titanium nitride, the bulk resist material comprises tin, and the grating comprises silicon oxide.

In one or more forty-ninth embodiments, a method of forming an integrated circuit comprises receiving a grating over a substrate, patterning, via EUV exposure, a plug of EUV resist between first and second lines of the grating, wherein the plug comprises a misaligned portion between the second line and a third line of the grating, depositing a first material layer on a top surface of the patterned plug, performing an angled etch to remove the first material layer and the misaligned portion of the plug, forming a second material layer over the grating and the plug, polishing the second material layer to expose the grating and the plug, and removing the plug to provide a pattern comprising the grating and remaining portions of the second material layer.

In one or more fiftieth embodiments, further to the forty-ninth embodiments, the angled etch is performed at an angle of not more than 45 degrees with respect to a top surface of the grating.

In one or more fifty-first embodiments, further to the forty-ninth or fiftieth embodiments, the photoresist comprises a chemically amplified resist.

In one or more fifty-second embodiments, an EUV photoresist composition comprises a solvent and an acrylate homopolymer in the solvent, the acrylate homopolymer comprising a halide in an alpha position of a monomer unit of the acrylate homopolymer.

In one or more fifty-third embodiments, further to the fifty-second embodiments, the halide comprises a chlorine atom.

In one or more fifty-fourth embodiments, an EUV photoresist composition comprises a solvent and an acrylate homopolymer in the solvent the acrylate homopolymer comprising a fluorinated group in a monomer unit of the acrylate homopolymer.

In one or more fifty-fifth embodiments, further to the fifty-fourth embodiments, the fluorinated group comprises two carbon atoms each having two fluorine atoms bonded thereto.

In one or more fifty-sixth embodiments, further to the fifty-fourth or fifty-fifth embodiments, the fluorinated group comprises a benzene ring having five fluorine atoms bonded thereto.

In one or more fifty-seventh embodiments, further to any of the fifty-fourth through fifty-sixth embodiments, the fluorinated group comprises a benzene ring having two trifluoromethyl groups bonded thereto.

In one or more fifty-eighth embodiments, a method of forming an integrated circuit comprises receiving a grating over a substrate, forming an EUV resist layer over the grating, exposing a portion of the EUV resist to define an exposed plug between first and second lines of the grating, wherein the exposure releases acid and/or ion species within the portion of the EUV resist, applying, during a post exposure bake of the EUV resist, an in-plane electric field to the EUV resist to move the acid and/or ion species toward one of the first or second lines, and developing the exposed and baked EUV resist layer to form a resultant plug between the first and second lines of the grating.

In one or more fifty-ninth embodiments, further to the fifty-eighth embodiments, the EUV resist layer comprises a chemically amplified resist.

In one or more sixtieth embodiments, further to the fifty-eighth or fifty-ninth embodiments, the in-plane electric field is applied orthogonal to the first and second lines of the grating.

In one or more sixty-first embodiments, a method of forming an integrated circuit comprises receiving a substrate comprising, on a surface thereof, a metal feature adjacent to a dielectric layer, forming an EUV resist layer over the substrate, exposing a portion of the EUV resist layer to define an exposed resist region at least partially over the metal feature, wherein the exposure releases acid and/or ion species within the exposed resist region, applying, during a post exposure bake of the EUV resist layer, an electric field to the EUV resist orthogonal to the substrate to move the acid and/or ion species toward the metal feature, and developing the exposed and baked EUV resist layer to form an opening over the metal feature.

In one or more sixty-second embodiments, further to the sixty-first embodiments, the EUV resist layer comprises a chemically amplified resist.

In one or more sixty-third embodiments, further to the sixty-first or sixty-second embodiments, the method further comprises forming a metal via in the opening, wherein the metal feature comprises a metal line.

In one or more sixty-fourth embodiments, further to any of the sixty-first through sixty-third embodiments, the method further comprises pre-baking, prior to the post exposure bake of the EUV resist layer, the EUV resist layer at a first temperature less than a second temperature of the post exposure bake.

In one or more sixty-fifth embodiments, further to any of the sixty-first through sixty-fourth embodiments, the method further comprises applying, during the pre-baking of the EUV resist layer, an electric field to the EUV resist orthogonal to the substrate.

In one or more sixty-sixth embodiments, further to any of the sixty-first through sixty-fifth embodiments, the first temperature is in the range of 60° C. to 80° C. and the second temperature is in the range of 90° C. to 120° C.

In one or more sixty-seventh embodiments, further to any of the sixty-first through sixty-sixth embodiments, the EUV resist layer is formed on a BARC layer on the metal feature and the dielectric layer.

In one or more sixty-eighth embodiments, an integrated circuit comprises a grating comprising a plurality of substantially parallel lines, a plug extending between a first sidewall of a first line of the grating and a second sidewall of a second line of the grating, the plug comprising a bulk inorganic cluster resist material and a molecule grafted to the first sidewall, the molecule comprising one of a cross-linking moiety, a capping agent, an electron quencher, or a Lewis base generator, and a metal line extending between the first sidewall, the second sidewall, and a third sidewall of the plug.

In one or more sixty-ninth embodiments, further to the sixty-eighth embodiments, the molecule is covalently bonded to the first sidewall at a first end of the molecule and a second end of the molecule comprises the cross-linking moiety, capping agent, or electron quencher.

In one or more seventieth embodiments, further to the sixty-eighth or sixty-ninth embodiments, the molecule comprises the cross-linking moiety, the plug further comprising cross-linking moieties released from a plurality of second molecules grafted to the first sidewall, the released cross-linking moieties comprising one of water, carboxylic acid, sulfonic acid, phosphonic acid, an alcohol, an amine, a diamine, or a diphosphine.

In one or more seventy-first embodiments, further to any of the sixty-eighth through seventieth embodiments, the molecule comprises the capping agent, the capping agent comprising one of a nitrobenzyl group or a hydroxyphenacyl group.

In one or more seventy-second embodiments, further to any of the sixty-eighth through seventy-first embodiments, the molecule comprises the capping agent, the molecule comprising a photosensitive protecting group and a capping group, the photosensitive protecting group comprising one of a nitrobenzyl group or a hydroxyphenacyl group and the capping group comprising one of an alkoxide, a thiolate, a phenolate, a carboxylate, a carbonate, or a carbamate.

In one or more seventy-third embodiments, further to any of the sixty-eighth through seventy-second embodiments, the molecule comprises the electron quencher, the plug further comprising a radical, ionic species, or basic species.

In one or more seventy-fourth embodiments, further to any of the sixty-eighth through seventy-third embodiments, the molecule comprises the electron quencher, the plug further comprising one of sulfonium, an onium salt, an electron-deficient arene, a nitroarene, an alkene substituted with an electron withdrawing group, or an inorganic element in a higher oxidation state.

In one or more seventy-fifth embodiments, further to any of the sixty-eighth through seventy-fourth embodiments, the integrated circuit further comprises a second plug between a third sidewall of a third line of the grating and a fourth sidewall of a fourth line of the grating, the second plug comprising the bulk resist material and a coating on the plug but absent at least a top surface of the third and fourth lines, the coating extending from the second plug to at least the third sidewall.

In one or more seventy-sixth embodiments, further to any of the sixty-eighth through seventy-fifth embodiments, the coating comprises OSi(CH$_3$)$_3$ and titanium nitride, the bulk resist material comprises tin, and the grating comprises silicon oxide.

In one or more seventy-ninth embodiments, further to any of the sixty-eighth through seventy-sixth embodiments, the integrated circuit further comprises a second plug between a third sidewall of a third line of the grating and a fourth sidewall of a fourth line of the grating, the plug comprising a bulk resist material and a coating on the third and fourth lines and absent at least a top surface of the second plug, the coating extending from at least the third sidewall to the second plug.

In one or more eightieth embodiments, an integrated circuit comprises a grating comprising a plurality of substantially parallel lines, a plug extending between a first sidewall of a first line of the grating and a second sidewall of a second line of the grating, the plug comprising a bulk inorganic cluster resist material and an additive comprising one of an electron quencher, a cross linking moiety, a radical scavenger, or a photoradical generator, and a metal line extending between the first sidewall, the second sidewall, and a third sidewall of the plug.

In one or more eighty-first embodiments, further to the eightieth embodiments, the additive comprises the electron quencher and the plug further comprises a molecule comprising a trapped metal oxide cation and a trapped radical group.

In one or more eighty-second embodiments, further to the eightieth or eighty-first embodiments, the molecule comprises the metal oxide cation covalently bonded to a first oxygen atom, a radical group covalently bonded to a second oxygen atom, and a benzene ring bonded to the first oxygen atom at a first position of the benzene ring and bonded to the second oxygen atom at a second position of the benzene ring opposite the first position.

In one or more eighty-third embodiments, further to any of eightieth through eighty-second embodiments, the additive comprises the cross linking moiety, the cross linking moiety comprising one of polyvinylalcohol, polyvinylpyridine, polyacrylic acid, polyhydroxystyrene, alcohol, pyridine, or carboxylic acid.

In one or more eighty-fourth embodiments, further to any of the eightieth through eighty-third embodiments, the additive comprises the radical scavenger, the radical scavenger comprising one of diphenyl oxalate, tetramethylpyrrolidine-N-oxide (TEMPO), a derivate of tetramethylpyrrolidine-N-oxide, 1,1-diphenylethene, a 1,1-diphenylethene related alkene trap, substituted 1,4-cyclohexadiene, an H-atom donating organic species, tris-trimethylsilylsilane (Me3Si)3SiH, an H-atom donating main group complex, butylated hydroxytoluene (BHT), or a phenolic compound related to butylated hydroxytoluene.

In one or more eighty-fifth embodiments, further to any of the eightieth through eighty-fourth embodiments, the bulk inorganic cluster resist material comprises hafnium oxide-methyl acrylate.

In one or more eighty-sixth embodiments, further to any of the eightieth through eighty-fifth embodiments, the additive comprises the photoradical generator, the photoradical generator comprising one of a sulfonium salt, a disilane, or a bis-stannane.

In one or more eighty-seventh embodiments, further to any of the eightieth through eighty-sixth embodiments, the bulk inorganic cluster resist material comprises hafnium carboxylate clusters.

In one or more eighty-eighth embodiments, a method comprises forming a grating comprising a plurality of substantially parallel lines over a substrate, forming a surface treatment material on the grating, the surface treatment material comprising one of a cross-linking moiety, a capping agent, an electron quencher, or a Lewis base generator, disposing an inorganic cluster resist layer over the surface treatment material, exposing the inorganic cluster resist layer with an extreme ultraviolet lithography (EUV) pattern to release a functional group corresponding to the cross-linking moiety, the capping agent, or the electron quencher, and developing the exposed inorganic cluster resist layer to pattern a plug within the grating.

In one or more eighty-ninth embodiments, further to the eighty-eighth embodiments, the surface treatment material comprises the electron quencher and exposing the inorganic cluster resist layer comprises exposing a hammerhead shaped exposure feature to define the plug.

In one or more ninetieth embodiments, further to the eighty-eighth or eighty-ninth embodiments, the surface treatment material comprises the cross-linking moiety, the plug further comprises cross-linking moieties released from a plurality of second molecules grafted to the first sidewall, the released cross-linking moieties comprising one of water, carboxylic acid, sulfonic acid, phosphonic acid, an alcohol, an amine, a diamine, or a diphosphine.

In one or more ninety-first embodiments, further to any of eighty-eighth through ninetieth embodiments, said developing patterns a second plug between third and fourth lines of the grating, the second plug comprising a misaligned portion between the third line and a fifth line of the grating, and the method further comprises depositing a first material layer on a top surface of the second plug, performing an angled etch to remove the first material layer and the misaligned portion of the second plug, forming a second material layer over the grating and the second plug, polishing the second material layer to expose the grating and the second plug, and removing the second plug to provide a pattern comprising the grating and remaining portions of the second material layer.

In one or more ninety-second embodiments, further to any of the eighty-eighth through ninety-first embodiments, said exposing releases acid or ion species within an exposed portion of the EUV resist and the method further comprises applying, during a post exposure bake of the exposed EUV resist, an in-plane electric field to the exposed EUV resist to move the acid or ion species toward one of the first or second lines.

In one or more ninety-third embodiments, further to any of the eighty-eighth through ninety-second embodiments, the substrate comprises, on a surface thereof, a metal feature adjacent to a dielectric layer and said exposing releases acid or ion species within an exposed region of the EUV resist at least partially over the metal feature, and the method further comprises applying, during a post exposure bake of the exposed EUV resist, an electric field to the exposed EUV resist substantially orthogonal to the surface of the substrate to move the acid or ion species toward the metal feature.

It will be recognized that the invention is not limited to the embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. An integrated circuit, comprising:
   a grating comprising a plurality of substantially parallel lines;
   a first plug extending between a first sidewall of a first line of the grating and a second sidewall of a second line of the grating, the first plug comprising a bulk inorganic cluster resist material and a molecule grafted to the first sidewall, the molecule comprising one of a cross-linking moiety, a capping agent, an electron quencher, or a Lewis base generator;
   a second plug between a third sidewall of a third line of the grating and a fourth sidewall of a fourth line of the grating, the second plug comprising the bulk inorganic cluster resist material;
   a coating on the second plug but absent at least a top surface of the third and fourth lines, the coating extending from the second plug to at least the third sidewall; and
   a metal line extending between the first sidewall, the second sidewall, and a third sidewall of the first plug.

2. The integrated circuit of claim 1, wherein the molecule is covalently bonded to the first sidewall at a first end of the molecule and a second end of the molecule comprises the cross-linking moiety, capping agent, or electron quencher.

3. The integrated circuit of claim 1, wherein the molecule comprises the cross-linking moiety, the first plug further comprising cross-linking moieties released from a plurality of second molecules grafted to the first sidewall, the released cross-linking moieties comprising one of water, carboxylic acid, sulfonic acid, phosphonic acid, an alcohol, an amine, a diamine, or a diphosphine.

4. The integrated circuit of claim 1, wherein the molecule comprises the capping agent, the capping agent comprising one of a nitrobenzyl group or a hydroxyphenacyl group.

5. The integrated circuit of claim 1, wherein the molecule comprises the capping agent, the molecule comprising a photosensitive protecting group and a capping group, the photosensitive protecting group comprising one of a nitrobenzyl group or a hydroxyphenacyl group and the capping group comprising one of an alkoxide, a thiolate, a phenolate, a carboxylate, a carbonate, or a carbamate.

6. The integrated circuit of claim 1, wherein the molecule comprises the electron quencher, the first plug further comprising a radical, ionic species, or basic species.

7. The integrated circuit of claim 1, wherein the molecule comprises the electron quencher, the first plug further comprising one of sulfonium, an onium salt, an electron-deficient arene, a nitroarene, an alkene substituted with an electron withdrawing group, or an inorganic element in a higher oxidation state.

8. The integrated circuit of claim 1, wherein the coating comprises $OSi(CH_3)_3$ and titanium nitride, the bulk inorganic cluster resist material comprises tin, and the grating comprises silicon oxide.

9. An integrated circuit comprising:
   a grating comprising a plurality of substantially parallel lines;
   a plug extending between a first sidewall of a first line of the grating and a second sidewall of a second line of the grating, the plug comprising a bulk inorganic cluster resist material and an additive comprising an electron quencher, the plug further comprising a molecule comprising a trapped metal oxide cation and a trapped radical group, wherein the molecule comprises the trapped metal oxide cation covalently bonded to a first oxygen atom, the trapped radical group covalently bonded to a second oxygen atom, and a benzene ring bonded to the first oxygen atom at a first position of the benzene ring and bonded to the second oxygen atom at a second position of the benzene ring opposite the first position; and
   a metal line extending between the first sidewall, the second sidewall, and a third sidewall of the plug.

10. The integrated circuit of claim 9, wherein the plug further comprises a cross linking moiety, the cross linking moiety comprising one of polyvinylalcohol, polyvinylpyridine, polyacrylic acid, polyhydroxystyrene, alcohol, pyridine, or carboxylic acid.

11. The integrated circuit of claim 9, wherein the plug further comprises a radical scavenger, the radical scavenger comprising one of diphenyl oxalate, tetramethylpyrrolidine-N-oxide (TEMPO), a derivate of tetramethylpyrrolidine-N-oxide, 1,1-diphenylethene, a 1,1-diphenylethene related alkene trap, substituted 1,4-cyclohexadiene, an H-atom donating organic species, tris-trimethylsilylsilane (Me3Si)3SiH, an H-atom donating main group complex, butylated hydroxytoluene (BHT), or a phenolic compound related to butylated hydroxytoluene.

12. The integrated circuit of claim 9, wherein the plug further comprises the a photoradical generator, the photoradical generator comprising one of a sulfonium salt, a disilane, or a bis-stannane.

13. An integrated circuit comprising:
   a grating comprising a plurality of substantially parallel lines;
   a plug extending between a first sidewall of a first line of the grating and a second sidewall of a second line of the grating, the plug comprising a bulk inorganic cluster resist material;
   a coating on the plug but absent at least a top surface of the first and second lines, the coating extending from the plug to at least the first sidewall; and
   a metal line extending between the first sidewall, the second sidewall, and a third sidewall of the plug.

14. The integrated circuit of claim 13, wherein the plug comprises a molecule covalently bonded to the second sidewall at a first end of the molecule and a second end of the molecule comprises a cross-linking moiety, capping agent, or electron quencher.

15. The integrated circuit of claim 13, wherein the plug comprises cross-linking moieties released from a plurality of molecules grafted to the second sidewall, the released cross-linking moieties comprising one of water, carboxylic acid, sulfonic acid, phosphonic acid, an alcohol, an amine, a diamine, or a diphosphine.

16. The integrated circuit of claim 13, wherein the plug comprises a molecule covalently bonded to the second sidewall, the molecule comprising a capping agent comprising one of a nitrobenzyl group or a hydroxyphenacyl group.

17. The integrated circuit of claim 13, wherein the plug comprises a molecule covalently bonded to the second sidewall, the molecule comprising a capping agent comprising a photosensitive protecting group and a capping group, the photosensitive protecting group comprising one of a nitrobenzyl group or a hydroxyphenacyl group and the capping group comprising one of an alkoxide, a thiolate, a phenolate, a carboxylate, a carbonate, or a carbamate.

18. The integrated circuit of claim 13, wherein the plug comprises a molecule covalently bonded to the second sidewall, the molecule comprising an electron quencher, and wherein the plug comprises a radical, ionic species, or basic species.

19. The integrated circuit of claim 13, wherein the plug comprises a molecule covalently bonded to the second sidewall, the molecule comprising an electron quencher, and wherein the plug further comprises one of sulfonium, an onium salt, an electron-deficient arene, a nitroarene, an alkene substituted with an electron withdrawing group, or an inorganic element in a higher oxidation state.

20. The integrated circuit of claim 13, wherein the coating comprises $OSi(CH_3)_3$ and titanium nitride, the bulk inorganic cluster resist material comprises tin, and the grating comprises silicon oxide.

* * * * *